United States Patent [19]

Phillips

[11] Patent Number: 4,742,286

[45] Date of Patent: May 3, 1988

[54] GAS BEARING X-Y-θ STAGE ASSEMBLY

[75] Inventor: Edward H. Phillips, Middletown, Calif.

[73] Assignee: Micro-Stage, Inc., Chatsworth, Calif.

[21] Appl. No.: 792,436

[22] Filed: Oct. 29, 1985

[51] Int. Cl.$^4$ .............................................. G05B 1/06
[52] U.S. Cl. ................................... 318/640; 318/687; 356/358
[58] Field of Search ............... 318/640, 480, 135, 687; 355/53, 54, 76, 132, 133, 72; 354/4, 354; 269/58, 73; 384/99; 356/349, 351, 358; 346/76 L; 29/569 R, 569 L, 587, 576 R, 572, 578

[56] References Cited

U.S. PATENT DOCUMENTS

| | | | |
|---|---|---|---|
| 2,696,565 | 12/1954 | Shockley | 318/640 X |
| 3,733,484 | 5/1973 | Bayard | 318/640 X |
| 3,889,164 | 6/1975 | Nishizawa | 318/687 X |
| 4,535,278 | 8/1985 | Asakawa | 318/135 X |
| 4,589,746 | 5/1986 | Pavone | 356/358 X |

Primary Examiner—William M. Shoop, Jr.
Assistant Examiner—Partick C. Keane
Attorney, Agent, or Firm—Joseph H. Smith

[57] ABSTRACT

An improved gas bearing X-Y-θ stage assembly is disclosed which has a base, a stage element with three retroreflectors fixedly mounted thereto, and a control system for controlling the movement of the stage element. The control system is made up of three interferometer measuring systems for measuring parameters associated with changes in position of the three retroreflectors as the stage element moves. Also, the control system includes a transport system for moving the three interferometers to maintain optical coupling between the interferometers and retroreflectors. In addition, the control system includes control circuitry for causing the stage element to move to a preselected X-Y-θ position in response to signals from the interferometer measuring systems. In one embodiment, a first interferometer of a first one of the three interferometer measuring systems is moved linearly by the transport system on a gas bearing slide in a direction parallel to the Y-axis of the system, while second and third interferometers of the other two interferometer measuring systems are moved together on a second gas bearing slide parallel to the X-axis of the system.

13 Claims, 14 Drawing Sheets

GAS BEARING X-Y-θ STAGE ASSEMBLY

BACKGROUND AND SUMMARY OF THE INVENTION

This invention relates generally to interferometer controlled gas bearing X-Y-θ stage assemblies commonly utilized to facilitate the movement of an object along precisely orthogonal X and Y axes of motion and rotationally along a θ-axis about a Z direction which is orthogonal to the X and Y axes. The invention is particularly concerned with three axis interferometer control of such X-Y-θ stage assemblies. One typical use for such gas bearing X-Y-θ stage assemblies is to step and position a semiconductive wafer along X, Y and θ coordinates under the imaging lens of a step-and-repeat camera. Thus, different regions of the semiconductive wafer can be sequentially aligned and exposed in accordance with a pattern on a reticle. A typical prior art gas bearing X-Y stage assembly is shown in U.S. Pat. No. 3,722,996 entitled Optical Pattern Generator or Repeating Projector or the Like and issued Mar. 27, 1973, to Wayne L. Fox. Disclosed in that patent is an X-Y stage which is located directly with respect to a top reference surface of a base by three stem supported gas bearings. It is guided along a reference edge surface of a generally L-shaped frame extending across the top reference surface of the base and orthogonal to a reference edge surface of the base by a pair of guideway bearings attached to the X-Y stage. The L-shaped frame is guided along the reference edge surface of the base by another pair of guideway bearings attached to the L-shaped frame. The orthogonality of the resulting X and Y axes of motion of the X-Y stage of that patent is determined by the accuracy of the orthogonal relationship of the reference edge surface of the L-shaped frame and the guideway bearings attached to the L-shaped frame used to guide the L-shaped frame along the reference edge surface of the base. Although no θ-axis rotational capability is disclosed in that patent, θ-axis stages are employed with such X-Y stage assemblies to construct an X-Y-θ stage assembly, which assembly typically comprises a θ-axis stage mounted on top of such an X-Y stage.

The gas bearing X-Y stage assembly of U.S. Pat. No. 3,722,996 has the disadvantage that the gas bearings used as guideway bearings for guiding the X-Y stage and the L-shaped frame along their corresponding reference surfaces have axial compliance. This axial compliance between the gas bearings and their corresponding reference surfaces allows the flying heights of the gas bearings to vary dynamically in response to varying loads impressed by positioning drives coupled to the X-Y stage. What would be desirable is an improved gas bearing X-Y-θ stage assembly wherein the X, Y and θ axes of motion are independently and directly controlled without any guideway bearings at all.

Another disadvantage of that gas bearing X-Y stage is its inefficient use of space. As illustrated in FIGS. 2 and 3 of U.S. Pat. No. 3,722,996, the size of the envelope encompassing the X-Y stage and its extent of travel along the X and Y axes of motion is only a fraction of the total lateral area of the gas bearing X-Y stage assembly. What would be desirable is an improved gas bearing X-Y-θ stage assembly wherein the size of the envelope encompassing the X-Y-θ stage and its extent of travel along the X, Y and θ axes of motion is substantially the same as the total lateral area of the improved gas bearing X-Y-θ stage assembly.

Still another disadvantage of the gas bearing X-Y stage assembly of U.S. Pat. No. 3,722,996 is that the mechanical orthogonality of its X and Y axes of motion is determined by the orthogonality of a reference surface (the reference edge surface of the L-shaped frame) and guideway bearings (the two guideway bearings attached to the L-shaped frame used for guiding the L-shaped member along the reference edge surface of the base) of an intermediate stage element (the L-shaped frame). What would be desirable is an improved gas bearing X-Y-θ stage assembly wherein the orthogonality of its X and Y axes of motion and its θ-axis orientation are controlled with reference to a three-dimensional interferometer measuring system, whose frame of reference is the base of the gas bearing X-Y-θ stage assembly.

The X-Y stage assembly of U.S. Pat. No. 3,722,996 utilizes plane mirror interferometer control of its X and Y axes of motion. Plane mirror interferometer control of two axes of motion is thoroughly discussed in Application Note 197-1 entitled Laser Interferometers for Position Feedback, available from the Hewlett-Packard Co. of Palo Alto, Calif. The two controlled axes of motion in such systems are parallel to either of two mirrors which are mounted on the X-Y stage. Thus, motion along the controlled X and Y axes of motion of that X-Y stage is not necessarily parallel to the edge reference surfaces mentioned hereinbefore and controlled motion along either axis generally requires active control and motion of both X and Y axis drive systems. The orthogonality of the controlled X and Y axes of motion and the straightness of either of them depends on the accuracies relating to fabrication and mounting of the two plane mirrors. Further, each mirror must be slightly longer than the corresponding length of travel of the X-Y stage. This length makes the mirrors hard to fabricate and requires the lateral area of the X-Y stage upon which they are mounted to be physically larger than its extent of travel along the X and Y axes of motion. This, in turn, enlarges the size of the envelope encompassing the X-Y stage and its extent of travel.

One improvement to the foregoing is described in U.S. Pat. No. 4,311,390 entitled Laser Interferometer Measuring Apparatus, issued Jan. 19, 1982 to Edward H. Phillips and incorporated herein by reference, wherein a pair of mirrors are symmetrically positioned with respect to the Y-axis of motion, and first and second control circuits move an X-Y stage along precisely orthogonal X and Y axes of motion. However, the geometries associated with that patent generally require the mirrors to be longer and the X-Y stage larger than standard orthogonally disposed mirrors would require.

It would be desirable to have an improved gas bearing X-Y-θ stage assembly wherein a three dimensional X-Y-θ interferometer measurement and control system utilizes three relatively small targets mounted on an X-Y-θ stage, comprising a single moving stage element, and a linear motor capable of controlled motions in the corresponding three directions, to position the X-Y-θ stage. Thus, a three dimensional interferometer controlled X-Y-θ stage of minimum lateral area could be used for positioning a semiconductive wafer under the projection lens of a step-and-repeat camera. Such an X-Y-θ stage would have superior overall accuracy because all three axes of motion would be interferometer controlled, including the θ-axis. Further, the complexity, bulk and cost of a three element stage assembly (comprising an X-stage, a Y-stage and a θ-stage) normally utilized in such equipment would be eliminated.

Accordingly, it is a principal object of this invention to provide an improved gas bearing X-Y-θ stage assembly wherein motions of an X-Y-θ stage along X, Y and θ axes are controlled by a three dimensional X-Y-θ interferometer measurement and control system.

Another object of this invention is to provide an improved gas bearing X-Y-θ stage assembly wherein the X-Y-θ stage comprises a single moving stage element.

Another object of this invention is to provide an improved gas bearing X-Y-θ stage assembly wherein the orthogonality of its X and Y axes of motion and its θ-axis orientation are controlled with reference to a three dimensional X-Y-θ interferometer measurement sub-system, whose frame of reference is the base of the gas bearing X-Y-θ stage assembly.

Another object of this invention is to provide an improved gas bearing X-Y-θ stage assembly wherein the X, Y and θ axes of motion are independently controlled without any guideway bearings.

Another object of this invention is to provide an improved gas bearing X-Y-θ stage assembly wherein the size of the envelope encompassing the X-Y-θ stage and its extent of travel along the X, Y and θ axes of motion is substantially the same as the total lateral area of the improved gas bearing X-Y-θ stage assembly.

Still another object of this invention is to provide an improved gas bearing X-Y-θ stage assembly wherein the three dimensional X-Y-θ interferometer measurement sub-system utilizes three relatively small targets mounted on the X-Y-θ stage to minimize the lateral area of the X-Y-θ stage.

These and other objects, which will become apparent from an inspection of the accompanying drawings and a reading of the associated description, are accomplished according to illustrated preferred embodiments of the present invention by providing improved gas bearing X-Y-θ stage assemblies wherein an X-Y-θ stage comprises a single moving stage element. The X-Y-θ stage is supported by three gas bearings, driven by an X-Y-θ linear motor, and controlled by a three dimensional X-Y-θ interferometer measurement and control system. The three dimensional X-Y-θ interferometer measurement and control system uses a three dimensional X-Y-θ interferometer measurement sub-system wherein the three dimensional X-Y-θ interferometer sub-system utilizes three relatively small targets mounted on the X-Y-θ stage.

In a first improved gas bearing X-Y-θ stage assembly, the frame of reference for the three dimensional X-Y-θ interferometer measurement sub-system comprises first and second interferometers mounted on a first vacuum stabilized gas bearing slide, and a third interferometer mounted on a second vacuum stabilized gas bearing slide. The first and second vacuum stabilized gas bearing slides move along orthogonal X and Y axes reference surfaces of a base of the first improved gas bearing X-Y-θ stage assembly synchronously with respect to the X and Y axes locations of the X-Y-θ stage. The three dimensional X-Y-θ interferometer measurement and control system moves the X-Y-θ stage along X and Y axes of motion, whose orthogonality is determined by the orthogonality of the X and Y axes reference surfaces of the base, and controls θ orientation.

In a second improved gas bearing X-Y-θ stage assembly, the frame of reference for the three dimensional X-Y-θ interferometer measurement sub-system comprises first and second interferometers mounted on a first gas bearing slide, and a third interferometer mounted on a second gas bearing slide. The first and second gas bearing slides move along reference surfaces symmetrically positioned with respect to the Y-axis of motion synchronously with respect to the location of the X-Y-θ stage. The three dimensional X-Y-θ interferometer measurement and control system moves the X-Y-θ stage along precisely orthogonal X and Y axes of motion and controls orientation.

In a third improved gas bearing X-Y-θ stage assembly, the frame of reference for the three dimensional X-Y-θ interferometer measurement sub-system comprises three gas bearing spindle mounted interferometers. The three gas bearing spindles are rotationally oriented in a synchronous manner with respect to the location of the X-Y-θ stage. The three dimensional X-Y-θ interferometer measurement and control system moves the X-Y-θ stage along computed orthogonal X and Y axes of motion and controls orientation.

DESCRIPTION OF THE PREFERRED EMBODIMENTS

Figure 1:
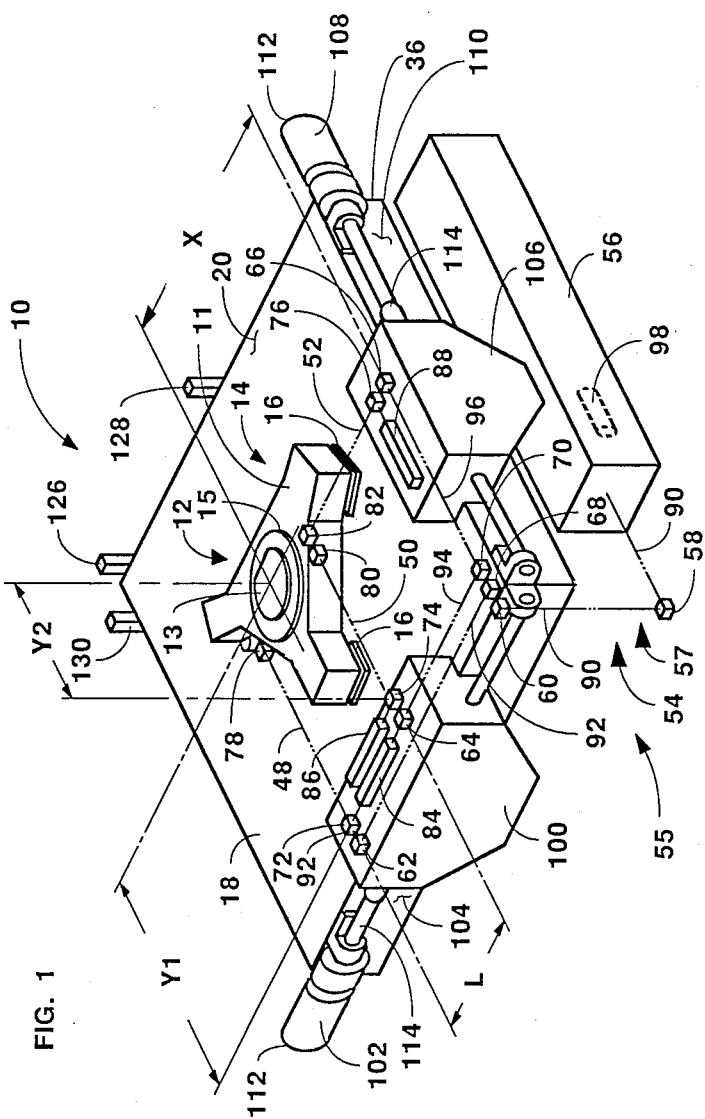
FIG. 1 is an isometric view of an improved gas bearing X-Y-θ stage assembly in accordance with a preferred embodiment of the present invention wherein first and second vacuum stabilized gas bearing slide mounted interferometers move along X and Y axes of the improved gas bearing X-Y-θ stage assembly.
Figure 2:
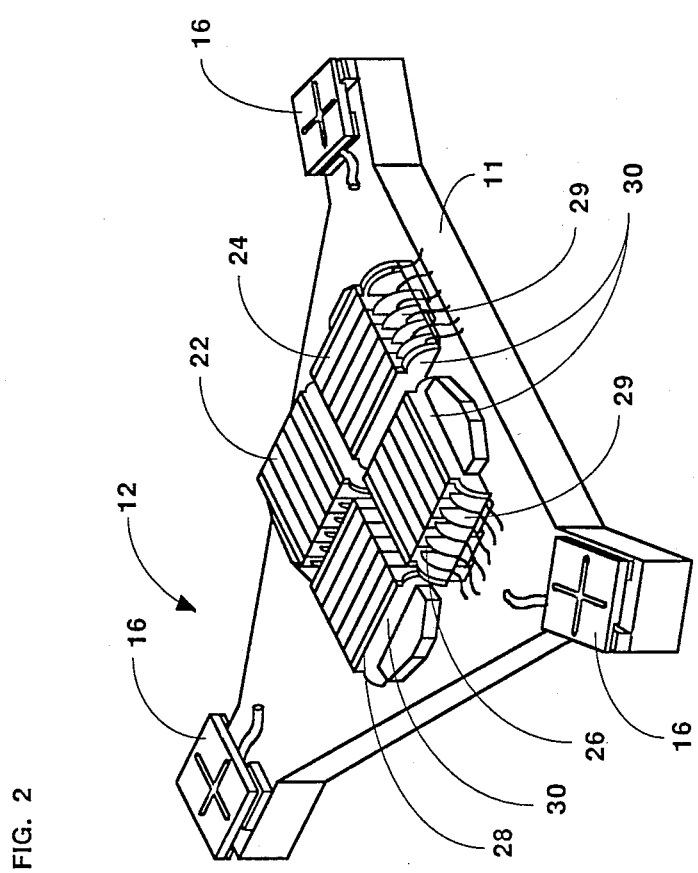
FIG. 2 is an isometric view of the underside of an X-Y-θ stage of the improved gas bearing X-Y-θ stage assembly showing details of the moving element of the X-Y-θ linear motor.
Figure 3:
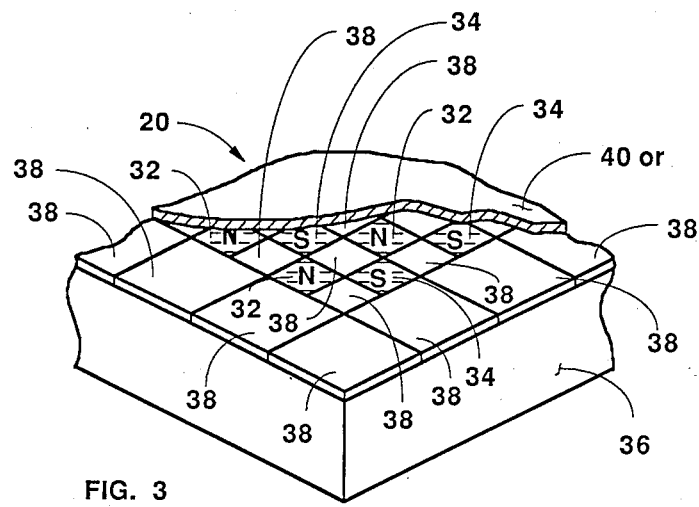
FIG. 3 is an isometric view of a base assembly of the improved gas bearing X-Y-θ stage assembly showing details of the static element of the X-Y-θ linear motor.
Figure 4:
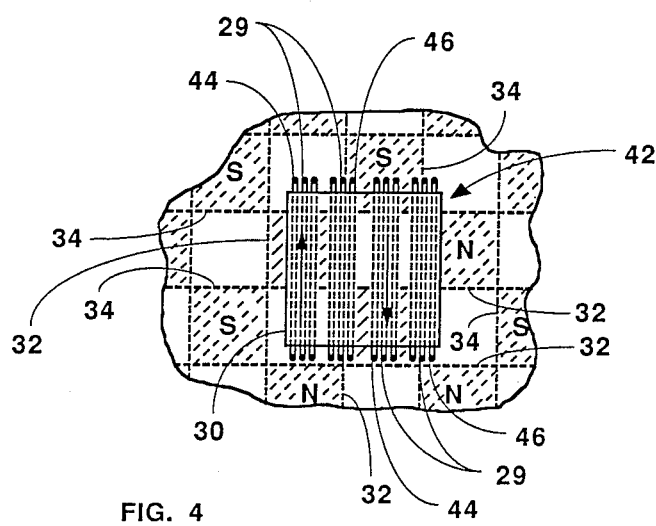
FIG. 4 is a graphic overlay of a multi-phase winding of a sub-element of the moving element of the X-Y-θ linear motor superposed upon magnets of the static element of the X-Y-θ linear motor.

Shown in FIG. 1 is an X-Y-θ stage assembly 10. An X-Y-θ stage 11, which comprises a moving element 12 of an X-Y-θ linear motor 14, is supported by three gas bearings 16 and moves over a base assembly 18, which comprises a static element 20 of the X-Y-θ linear motor 14. The X-Y-θ stage 11 may be used to step and position a semiconductive waver 13, which is mounted on a wafer chuck 15, under a utilization device (not shown) such as an imaging lens of a step-and-repeat camera. FIG. 2 shows four sub-elements 22, 24, 26 and 28 of the moving element 12 of the X-Y-θ linear motor 14 mounted on the underside of the X-Y-θ stage 11. Each of the sub-elements comprises a multi-phase winding 29 in a slotted magnetic element 30 (see FIGS. 2 and 4). Sub-elements 22 and 26 have their slots cut substantially parallel to the X-axis while sub-elements 24 and 28 have their slots cut substantially parallel to the Y-axis. FIG. 3 shows a checker-board pattern of north poled magnets 32 and south poled magnets 34 that comprise the static element 20 of the X-Y-θ linear motor 14 and are mounted on a base casting 36 of the base assembly 18. The spaces between the magnets and surrounding the magnets are filled with non-magnetic pieces 38. Both the magnets 32 and 34 and the non-magnetic pieces 38 are bonded to the base casting 36 by using epoxy or the like. A thin layer 40 of non-magnetic material such as ceramic or glass is similarly bonded over the matrix of magnets 32 and 34 and non-magnetic pieces 38. The layer 40 is ground and lapped in a flat and smooth manner to form a gas bearing reference surface. The lateral area of the magnets 32 and 34 is geometrically similar to the lateral area of slotted magnetic elements 30 but they have lineal lateral dimensions equal to 50% of the slotted magnetic elements. FIG. 4 shows a graphic overlay of a multi-phase winding 29 superposed over a randomly positioned portion of the array of north poled magnets 32 and south poled magnets 34. As an example, a two phase winding 42 with a first phase 44 conducting and a second phase 46 not conducting for this particular position of the slotted magnetic element 30 is shown. The direction of the current flow is reversed as it flows over north and south poled magnets. Thus, all portions of the winding produce thrust in the same direction. The end turns are wound away from the magnets so they don't contribute sideways thrust. Hence, for the moving element 12 as a whole, equal currents in both sub-elements 22 and 26, or 24 and 28 will produce pure thrust in the Y or X directions, respectively, while equal but oppositely directed currents in sub-elements 22 and 26, and/or 24 and 28 will produce pure torque in the θ direction. Position and velocity control of the X-Y-θ stage 11 along the X, Y and θ axes of motion is accomplished by servo control of the currents in the multiphase windings of the four sub-elements. The extent of the resulting X-Y-θ stage motions are determined by the size of the array of north poled magnets 32 and south poled magnets 34 in the X and Y directions and by the geometry of the slotted magnetic elements 30 in the direction. Motion of plus or minus 3 degrees in the direction is often required for aligning a workpiece. The X-Y-θ linear motor is described in detail in now abandoned U.S. patent application Ser. No. 776,365 entitled Single Plane Orthogonally Movable Drive System, filed on Sept. 16, 1985 by Walter E. Hinds and incorporated herein by reference.

Figure 6:
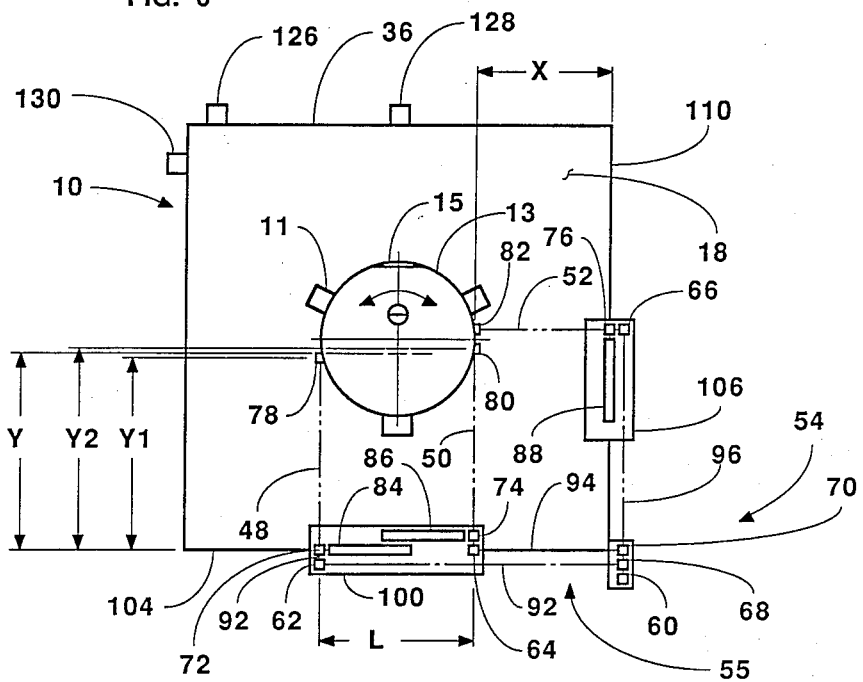
FIG. 6 is a plan view showing the measurement paths of an X-Y-θ interferometer measurement sub-system used in the improved gas bearing X-Y-θ stage assembly of FIG. 1.

As illustrated in FIGS. 1 and 6, the X-Y-θ stage assembly 10 further comprises three interferometer distance measuring paths 48, 50 and 52 of an X-Y-θ interferometer measuring sub-system 54 of an X-Y-θ interferometer measuring and control system 55 (to be described hereinafter), for measuring distances $Y_1$, $Y_2$ and X, respectively. The interferometer measuring sub-system 54 may comprise an optical laser interferometer system 57 such as one manufactured by the Hewlett-Packard Co. of Palo Alto, Calif. Such a system can be constructed of a laser source 56, beam benders 58, 60, 62, 64 and 66, a 33% beam splitter 68, a 50% beam splitter 70, interferometers 72, 74 and 76, retroreflectors 78, 80 and 82, and receivers 84, 86 and 88.

A retroreflector is defined as an optical element that reflects light in such a manner that incident and reflected light beams are parallel to one another. For instance, a plane mirror can serve as a retroreflector when an incident light beam is orthogonal to the reflective surface of the plane mirror; a roof mirror can serve as a retroreflector when an incident light beam is orthogonal to the apex of the roof mirror; and a cube corner mirror will always serve as a retroreflector whenever an incident light beam falls within the cube corner mirror's acceptance apperture. Since the X-Y-θ stage 11 is subject to motions in the X, Y and θ directions, and the retroreflectors 78, 80 and 82 are fixedly mounted on the X-Y-θ stage (as described hereinafter), incident interferometer measuring light beams may be located in a plane parallel to the X-Y-θ axes of motion but they will not generally be orthogonal to the retroreflectors. Thus, either roof or cube corner mirrors may be used for the retroreflectors 78, 80 and 82.

Light comprising reference and measurement wavelengths passes from the laser source 56 along paths 90 to the 33% beamsplitter 68. Thirty-three percent of the light energy of both wavelengths passes along paths 92 to the interferometer 72 where the reference wavelength is reflected by the interferometer to the receiver 84 and the measurement wavelength is transmitted along the interferometer distance measuring path 48 to the retroreflector 78. This light is reflected back along the interferometer distance measuring path 48 by the retroreflector to the interferometer 72 which reflects it into the receiver 84. The receiver mixes the two wavelengths, detects their difference frequency $\Delta f_1$, and transmits the difference frequency $\Delta f_1$ to detection circuitry described hereinafter.

The remaining light energy of both wavelengths is transmitted through the 33% beamsplitter 68 to the 50% beam splitter 70 where it is split in half and passes along paths 94 and 96 to interferometers 74 and 76, respectively. Each set of interferometer 74 or 76, retrorefloctor 80 or 82, and receiver 86 or 88 processes its incoming light energy in exactly the same manner as described above and transmits its own difference frequency $\Delta f_2$ or $\Delta f_x$, respectively, to the detection circuitry described hereinafter. In each case, when these difference frequencies vary by $\delta f_n$ from a reference difference frequency $\Delta f$ (supplied from a detector 98 contained within the laser source 56), $\delta f_n$ is a measurement of the velocity with which the length of interferometer distance measuring path 48, 50 or 52 is changing. Integration with respect to time of $\delta f_n$ with a reversible counter is a measure of the change of the length of interferometer distance measuring path 48, 50 or 52. Detailed operational information for this optical laser interferometer system is shown in a system operating and service manual entitled Laser Transducer System 5501A which is available the Hewlett-Packard Co. and it is incorporated by reference herein.

The laser source 56, beam benders 58 and 60, 33% beam splitter 68, and 50% beam splitter 70 are all fixedly mounted with respect to the base assembly 18. The beam benders 62 and 64, interferometers 72 and 74, and receivers 84 and 86 are fixedly mounted on a first vacuum stabilized gas bearing slide 100 which is driven by an X-axis drive 102 along a Y-axis reference surface 104 of the base casting 36. The beam bender 66, interferometer 76, and receiver 88 are fixedly mounted on a second vacuum stabilized gas bearing slide 106 which is driven by a Y-axis drive 108 along an X-axis reference surface 110 of the base casting 36. The retroreflectors 78, 80 and 82 are all fixedly mounted on the X-Y-$\theta$ stage 11 and are oriented such that they nominally face interferometers 72, 74 and 76, respectively. Thus, the interferometer distance measuring paths 48, 50 and 52 determine the values of $Y_1$, $Y_2$ and X to the X-Y-$\theta$ stage, respectively, as measured with respect to the Y-axis reference surface 104 and X-axis reference surface 110, respectively. Each of the X-axis drive 102 and the Y-axis drive 108 comprise a drive motor-encoder 112 and a leadscrew-nut assembly 114. The vacuum stabilized gas bearing slides 100 and 106 are positioned synchronously with respect to the X and Y axes positions of the X-Y-$\theta$ stage 11, respectively (to a nominal accuracy of perhaps 0.01 inch), by the X-Y-$\theta$ interferometer measuring and control system 55 to maintain optical coupling of the interferometer distance measuring paths 48, 50 and 52.

Figure 5:
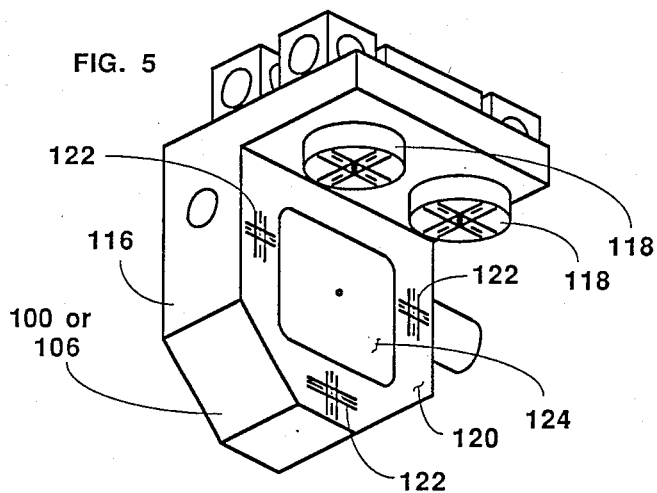
FIG. 5 is an isometric view of a vacuum stabilized slide used in the improved gas bearing X-Y-θ stage assembly of FIG. 1.

FIG. 5 shows a vacuum stabilized gas bearing slide 100 or 106 which comprises a body 116 and two stem supported gas bearings 118. A flat surface 120 of the body 116 additionally comprises at least three gas bearings 122 and a vacuum pocket 124. The gas bearings 118 and 122 as well as the three gas bearings 16 may be fabricated as described in now abandoned U.S. patent application Ser. No. 759,185 entitled Improved Gas Bearing, filed on July 26, 1985, by Edward H. Phillips, and incorporated by reference herein.

The X-Y-$\theta$ stage assembly 10 is capable of positioning the X-Y-$\theta$ stage 11 along the X, Y and $\theta$ axes as shown in FIG. 6. The interferometer distance measuring paths 48 and 50, which measure $Y_1$ and $Y_2$, respectively, are parallel and are separated by a length L. The X-Y-$\theta$ stage location along the Y-axis, Y, is determined by $Y = (Y_1 + Y_2)/2$, and the X-Y-$\theta$ stage angle, $\theta$, is determined by $\theta = \arctan(Y_2 - Y_1)/L$.

The measured distances $Y_1$, $Y_2$ and X are relative quantities which are set at predetermined values at a home position of the X-Y-$\theta$ stage 11. The home position of the X-Y-$\theta$ stage is located by moving the X-Y-$\theta$ stage into physical contact with stops 126, 128 and 130.

The X-Y-$\theta$ interferometer measuring and control system 55 moves the X-Y-$\theta$ stage 11 along the X, Y and $\theta$ axes of motion in response to instructions from a computer 140 as described hereinafter. These instructions include three dimensional present position, velocity with respect to position, and endpoint position of the X-Y-$\theta$ stage 11. The computer 140 is able to determine endpoint position addresses to a resolution of a selected binary fraction of a wavelength of the electromagnetic radiation used by the X-Y-$\theta$ interferometer measuring sub-system 54.

Figure 7:
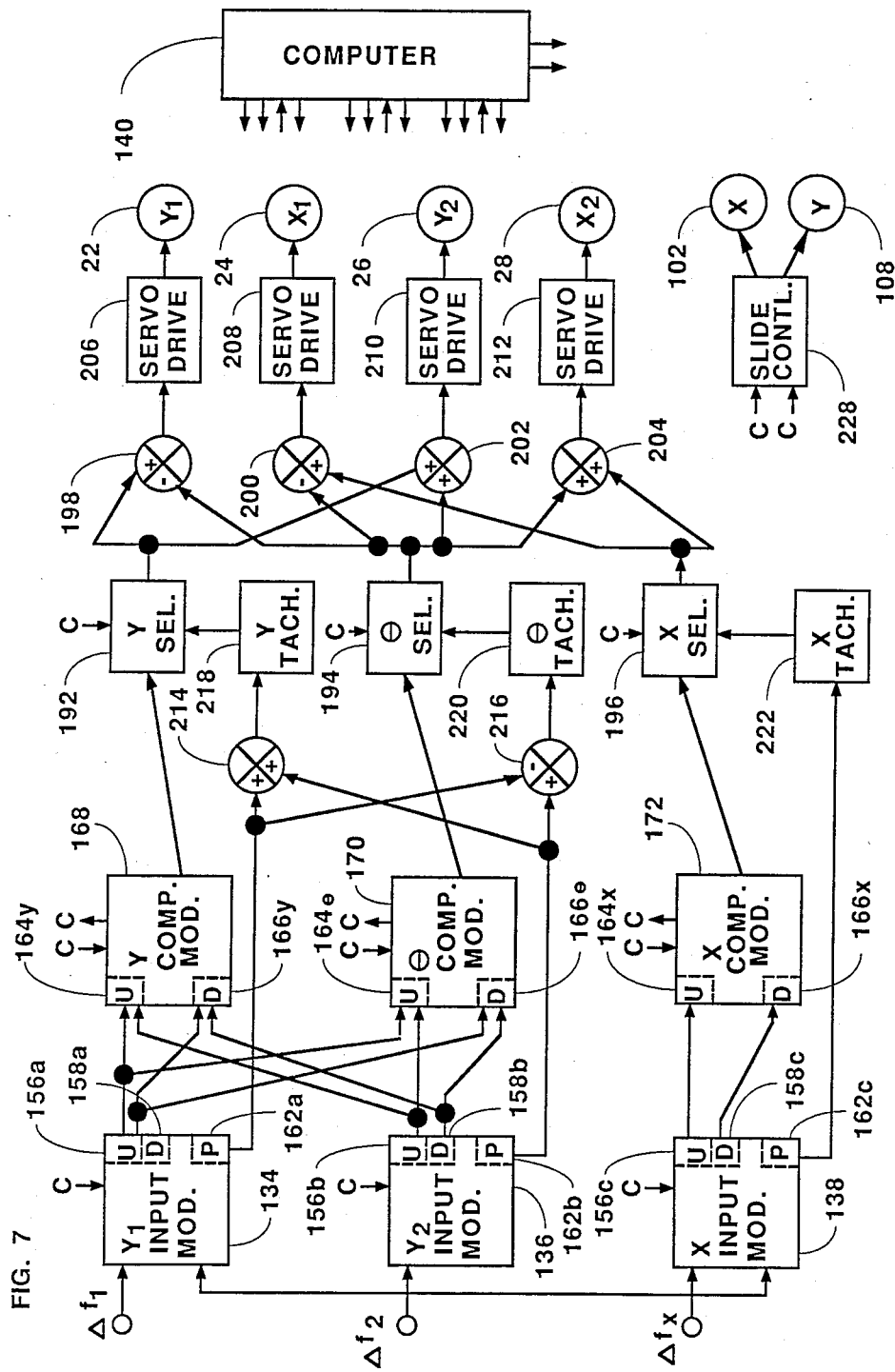
FIG. 7 is a detailed block diagram of non-interferometer portions of an X-Y-θ interferometer measurement and control system used to control the improved gas bearing X-Y-θ stage assembly of FIG. 1.

The X-Y-$\theta$ measuring and control system 55 is made up of the interferometric portion already described and a control portion shown in FIG. 7 as circuit 132. (Portions of the circuit 132 are related to a control circuit described in U.S. Pat. No. 4,330,752 entitled Position Control Circuit, issued May 18, 1982 to Ruediger F. Rauskolb, and incorporated herein by reference.) Inpt signals to the circuit 132 include $\Delta f$, the reference difference frequency between the reference and measurement wavelengths, $\Delta f_1 = \Delta f \pm \delta f_1$, the difference frequency from the receiver 84, $\Delta f_2 = \Delta f \pm \delta f_2$, the difference frequency from the receiver 86, and $\Delta f_x = \Delta f \pm \delta f_x$, the difference frequency from the receiver 88. The reference difference frequency $\Delta f$ and one of the difference frequencies $\Delta f_1$, $\Delta f_2$ and $\Delta f_x$ are applied to a $Y_1$ input module 134, a $Y_2$ input module 136 and an X input module 138, respectively.

Figure 8:
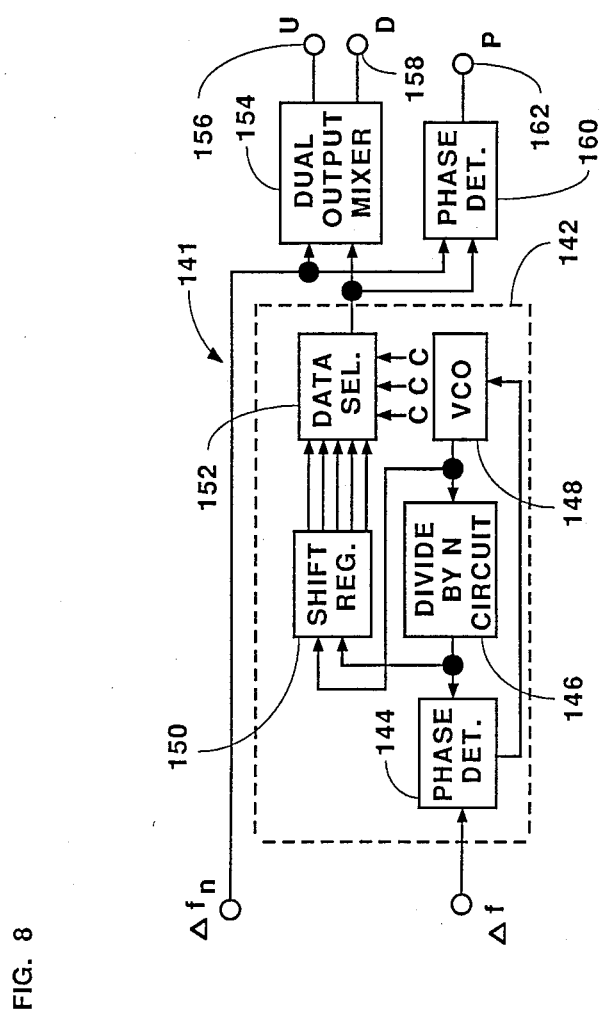
FIG. 8 is a detailed block diagram of an input module of the X-Y-θ interferometer measurement sub-system.

FIG. 8 shows a detailed block diagram of a circuit 141 used in any of the three identical input modules 134, 136 or 138. The circuit 141 includes a variable phase shifter 142 for receiving the reference difference frequency $\Delta f$ and producing an output signal of the same frequency but shifted in phase as determined by a binary select code from the computer 140. The phase shifter 142 includes a phase detector 144 having a first input at which the reference difference frequency $\Delta f$ signal is applied and a second input at which an output signal from a divide by N circuit 146 is applied as hereinafter explained. In response to these input signals the phase detector 144 applies an output voltage signal to a voltage controlled oscillator 148 so as to drive the voltage controlled oscillator to produce an output signal having a frequency N times greater than the reference difference frequency $\Delta f$. This output signal from the voltage controlled oscillator 148 is applied both to an input of the divide by N circuit 146 and to a clock input of a shift register 150. The divide by N circuit 146 divides this output signal by N, which for purposes of illustration is herein taken to have a value of eight, and applies the resultant output signal to the second input of the phase detector 144 and also to a data input of the shift register 150. In response to the applied output signals from the divide by N circuit 146 and the voltage controlled oscillator 148, the shift register 150 supplies N (or eight) output signals of different phase (each such output signal differing in phase from the preceding one by 360°/N or 45°) to a data selector 152. The data selector 152 supplies a selected one of these output signals from the shift register 150 to the output of the variable phase shifter 142 as determined by a three bit select code signal supplied by the computer 140. As indicated above, the selected output signal has the same frequence $\Delta f$ as the reference difference frequency but is shifted in phase. It is in this manner that the variable phase shifter 142 is able to provide a position reference signal of the selected binary fraction of the wavelength of the electromagnetic radiation used by the X-Y-$\theta$ interferometer measuring sub-system 54.

The circuit 141 also includes a dual output mixer 154 for providing first and second input module output signals at terminals 156 and 158, respectively, comprising up or down pulses indicative of whole half wavelengths of electromagnetic radiation detected by the receiver 84, 86 or 88, respectively. The dual output mixer 154 generates either up or down pulses by subtracting the phase shifted $\Delta f$ signal which is applied to a first input terminal of the dual output mixer from the $\Delta f \pm \delta f_n$ signal which is applied to a second input terminal of the dual output mixer, where $\Delta f \pm \delta f_n$ is any one of the difference signals. If $\delta f_n$ is positive an up pulse is generated at the first output terminal 156. If $\delta f_n$ is negative a down pulse is generated at the second output terminal 158.

Also included in the circuit 141 is a phase detector 160 for providing a third input module output signal at a terminal 162 comprising an analog signal indicative of final position errors within the binary fraction of a wavelength of the electromagnetic radiation detected by the receiver 84, 86 or 88, respectively, selected by the computer 140. The phase detector 60 generates a signal indicative of the difference in phase between the phase shifted $\Delta f$ signal which is applied to a first input terminal of the phase detector and the $\Delta f \pm \delta f_n$ signal which is applied to a second input terminal of the phase detector. The output signals at the terminals 156, 158 and 162 are provided by each of the input modules 134, 136 and 138. Letter suffixes are appended to each output terminal indicator to designate each output terminal's corresponding input module. In this way, the output signals from the output terminals of each input module can be differentiated as follows: Output signals from terminals 156a, 158a and 162a are provided by input module 134, output signals from terminals 156b, 158b and 162b are provided by input module 136, and output signals from terminals 156c, 158c and 162c are provided by input module 138.

Figure 9:
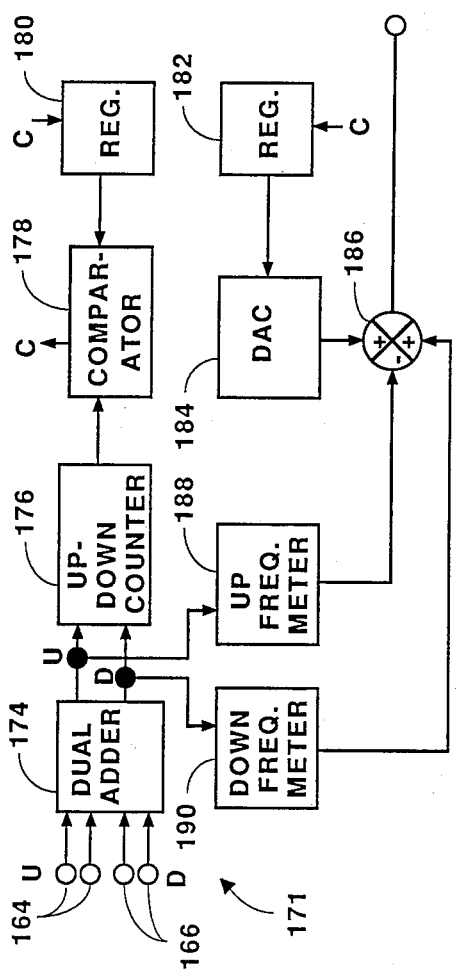
FIG. 9 is a detailed block diagram of a comparator module of the X-Y-θ interferometer measurement sub-system.

The first and second input module output signals from terminals 156a, 158a, 156b, 158b, 156c and 158c are selectively applied to up and down input terminals 164y and 166y, 164 and 166, and 164x and 166x of a Y comparator module 168, a $\theta$ comparator module 170, and an X comparator module 172, respectively. FIG. 9 shows a detailed block diagram of a typical circuit 171 which can be used in any of the three identical comparator modules 168, 170 or 172.

A first plurality of input signals to an adder 174 serves as the input signals to terminals 164y, 164$\theta$ or 164x and a second plurality of input signals to the adder 174 serves as the input signals to terminals 166y, 166$\theta$ or 166x of the circuit 171. The adder 174 produces a pulse train representing the sum of pulses applied to the input terminals 164y, 164$\theta$ or 164x on a first output terminal of the adder and a pulse train representing the sum of pulses applied to the input terminals 166y, 166$\theta$ or 166x on a second output terminal of the adder. The pulse trains produced on the first and second output terminals of the adder 174 are applied to an up-down counter 176 for counting those pulses to produce a $\Delta Y$, $\Delta \theta$ or $\Delta X$ digital output signal proportional to the algebraic sum of the pulses produced on the first output terminal minus the pulses produced on the second output terminal of the adder. In effect, the up-down counter 176 integrates the sum of the selected component velocities $dY_1/dt$, $dY_2/dt$ and $dX/dt$ of the retroreflectors 78, 80 and 82 with respect to the interferometers 72, 74 and 76, respectively, to produce the $\Delta Y$, $\Delta \theta$ or $\Delta X$ digital output signal. The $\Delta Y$, $\Delta \theta$ or $\Delta X$ digital output signal is applied to a first input terminal of a comparator 178. Digital end point data signals, $Y_e$, $\theta_e$ or $X_e$, from the computer 140 are stored in a register 180 and applied to a second input terminal of the comparator 178. The comparator 178 produces a digital comparison signal equal to the algebraic sum of the digital signals applied to the first and second input terminals of the comparator. The digital comparison signal is proportional to the distance the X-Y-$\theta$ stage 11 must be moved along the Y, $\theta$ or X axes of motion to reach the Y, $\theta$ or X axis position specified by the $Y_e$, $\theta_e$ or $X_e$ digital end point data signal. The digital comparison signal is applied to the computer 140 which in response to a non-zero digital comparison signal sequentially stores each of a series of digital velocity signals in a register 182. The time envelope of these digital velocity signals stored in the register 182 defines an optimum profile of accelerating, maximum, and decelerating velocities, as determined in accordance with well known techniques, for the distance the X-Y-$\theta$ stage 11 is to be moved along the Y, $\theta$ or X axis. Each digital velocity signal stored in the register 182 is applied to a digital-to-analog converter 184 which converts it to an analog voltage signal and applies it to a first positive input terminal of a summing circuit 186. The pulse trains produced at the first and second output terminals of the adder 174 are also applied to the input terminals of an up frequency meter 188 and a down frequency meter 190, respectively. The up frequency meter 188 and the down frequency meter 190 produce analog output signals proportional to the frequency of pulses present in the pulse trains produced by the first and second output signals of the adder 174. The algebraic sum of the analog output signals of the up frequency meter 188 and the down frequency meter 190 is representative of the selected component velocities $dY_1/dt$, $dY_2/dt$ and $dX/dt$ of the retroreflectors 78, 80 and 82 with respect to the interferometers 72, 74 and 76 and is equivalent to a tachometer output. The analog output signals of the up frequency meter 188 and the down frequency meter 190 are applied to negative and second positive input terminals, respectively, of the summing circuit 186. The output signal of the Y comparator module 168, $\theta$ comparator module 170, or X comparator module 172 comprises the output signal of the summing circuit 186 and is an analog signal representative of the difference between the computer derived output of the digital-to-analog converter 184 and the actual velocity of the X-Y-$\theta$ stage 11 along the Y-, $\theta$- or X-axis of motion.

In the circuit 132 shown in FIG. 7, $Y_1$ input module 134 output terminal 156a is connected to Y comparator module 168 input terminal 164y and θ comparator module 170 input terminal 166θ; Y₁ input module 134 output terminal 158a is connected to Y comparator module 168 input terminal 166y and θ comparator module 170 input terminal 164θ; Y₂ input module 136 output terminal 156b is connected to Y comparator module 168 input terminal 164y and θ comparator module 170 input terminal 164θ; Y₂ input module 136 output terminal 158b is connected to Y comparator module 168 input terminal 166y and θ comparator module 170 input terminal 166θ; X input module 138 output terminal 156c is connected to X comparator module 172 input terminal 164x; and X input module 138 output terminal 158c is connected to X comparator module 172 input terminal 166x. Thus the output signals of the Y comparator module 168 and the comparator module 170 relate to the sum of the velocities dY₁/dt and dY₂/dt and the difference of the velocities dY₂/dt and dY₁/dt, respectively, as determined by the following differentials (with respect to time) of the equations for Y and θ, $$dY/dt = (dY_1/dt + dY_2/dt)/2 \text{ and}$$

$$d\theta/dt = (dY_2/dt - dY_1/dt)/L,$$

and the output signal of the X comparator module 172 relates to the velocity dX/dt. The output signals of the Y, θ and X comparator modules 168, 170 and 172, respectively, are applied to first input terminals of a Y selector circuit 192, a θ selector circuit 194 and an X selector circuit 196, respectively.

In response to a non-zero output from any of the comparators 178 in any of the comparator modules 168, 170 or 172, the computer 140 activates the selector circuits 192, 194 and 196 to apply the output signals of the comparator modules to selected ones of four summing circuits 198, 200, 202 and 204 as follows: The output signal from the Y Selector circuit 192 is applied to the positive input terminals of the summing circuits 198 and 202. The output signal from the θ selector circuit 194 is applied to the negative input terminals of the summing circuits 198 and 200, and the positive input terminals of the summing circuits 202 and 204. And, the output signal from the X selector circuit 196 is applied to the positive input terminals of the summing circuits 200 and 204. The output signals of the summing circuits 198, 200, 202 and 204 are applied to servo drive circuits 206, 208, 210 and 212, respectively, for driving the sub-elements 22, 24, 26 and 28, respectively, of the moving element 12 of the X-Y-θ linear motor 14. Thus, a non-zero output signal from the Y comparator module 168, θ comparator module 170 or X comparator module 172 results in thrust in the Y, θ or X direction, respectively. The X-Y-θ stage 11 then accelerates to reduce that non-zero output and cause the velocity of the X-Y-θ stage to conform to the input signals from the computer 140 to the registers 182 of the comparator modules 168, 170 and 172.

When the input signals to the computer 140 from the output terminals of the comparators 178 of the comparator modules are all zero, the X-Y-θ stage 11 is located at the Y, θ and X axis positions specified by the $Y_e$, $\theta_e$ and $X_e$ digital end point data signals stored in the registers 180 by the computer 140 to within an accuracy of one count of the up-down counters 176. It is necessary to utilize the output signals from the phase detectors 160 of the input modules 134, 136 and 138 to reach the actual positions specified by the $Y_e$, $\theta_e$ and $X_e$ digital end point data signals. First, the output signals at terminals 162a and 162b provided by the input modules 134 and 136, respectively, are summed in a Y summing circuit 214 for providing a Y-phase detected output signal and the output signal at terminal 162a is subtracted from the output signal at terminal 162b in a θ summing circuit 216 for providing a θ-phase detected output signal. Then each of the Y-, θ- and X-phase detected output signals provided by the Y summing circuit 214, summing circuit 216 and the output terminal 162c of input module 138, respectively, is representative of the remaining position errors of the X-Y-θ stage 11 along the Y, θ and X axes of motion, respectively. The Y, θ and X phase detected output signals are processed by tachometer stabilizer circuit 218, 220 and 222, respectively.

Figure 10:
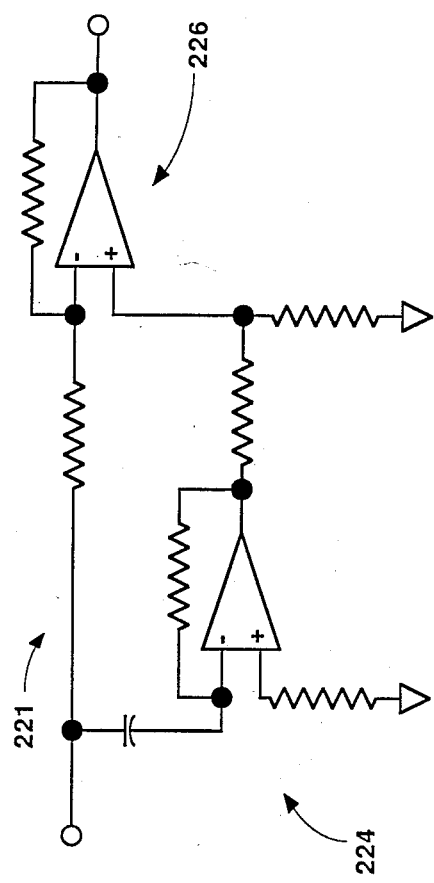
FIG. 10 is a detailed block diagram of a tachometer stabilizer circuit of the X-Y-θ interferometer measurement and control system.

FIG. 10 shows a detailed diagram of a circuit 221 which can be used in any of the three identical tachometer stabilizer circuits 218, 220 or 222. The circuit 221 includes a differentiating amplifier 224 coupled to the positive input terminal of a summing amplifier 226. The Y-, θ- or X-phase detected output signal that is applied to the tachometer stabilizer circuit 218, 220 or 222, respectively, is coupled to the negative input terminal of the differentiating amplifier 224 and the negative input terminal of the summing amplifier 226. The output signal of the tachometer stabilizer circuit comprises the output signal of the summing amplifier 226 and is inversely proportional to a sum of both the Y-, θ- or X-phase detected signal and the differential, with respect to time, of the Y-, θ- or X-phase detected signal. This output signal is equivalent to the sum of a position error signal and a stabilizing tachometer signal. The output signals of the tachometer stabilizer circuits 218, 220 and 222 are applied to second input terminals of the Y selector circuit 192, the θ selector circuit 194 and the X selector circuit 196, respectively.

In response to zero output signals from all of the comparator modules 168, 170 and 172, the computer 140 activates the selector circuits 192, 194 and 196 to apply the output signals of the tachometer stabilizer circuits 218, 220 and 222 to the selected ones of the four summing circuits 198, 200, 202 and 204, servo drive circuits 206, 208, 210 and 212, and sub-elements 22, 24, 26 and 28, respectively, as described hereinbefore. Thus, thrust from the sub-elements of the moving element 12 of the X-Y-θ linear motor 14 is continually modulated to cause the Y, θ and X phase detected output signals to be reduced to zero. The X-Y-θ stage 11 is then positioned precisely at the Y, θ and X axis positions specified by the $Y_e$, $\theta_e$ and $X_e$ digital end point data signals stored in the registers 180 by the computer 140, as phase shifted by the data selectors 152 in response to the three bit select code signals supplied by the computer.

In addition, a pair of input signals from the computer 140 to a slide positioning controller 228 activate the slide positioning controller as required for moving the vacuum stabilized gas bearing slides 100 and 106 synchronously with respect to the X and Y axis positions of the X-Y-θ stage 11. As described hereinbefore, this synchronous control is required to maintain optical coupling of the interferometer measuring paths 48, 50 and 52.

Figure 11:
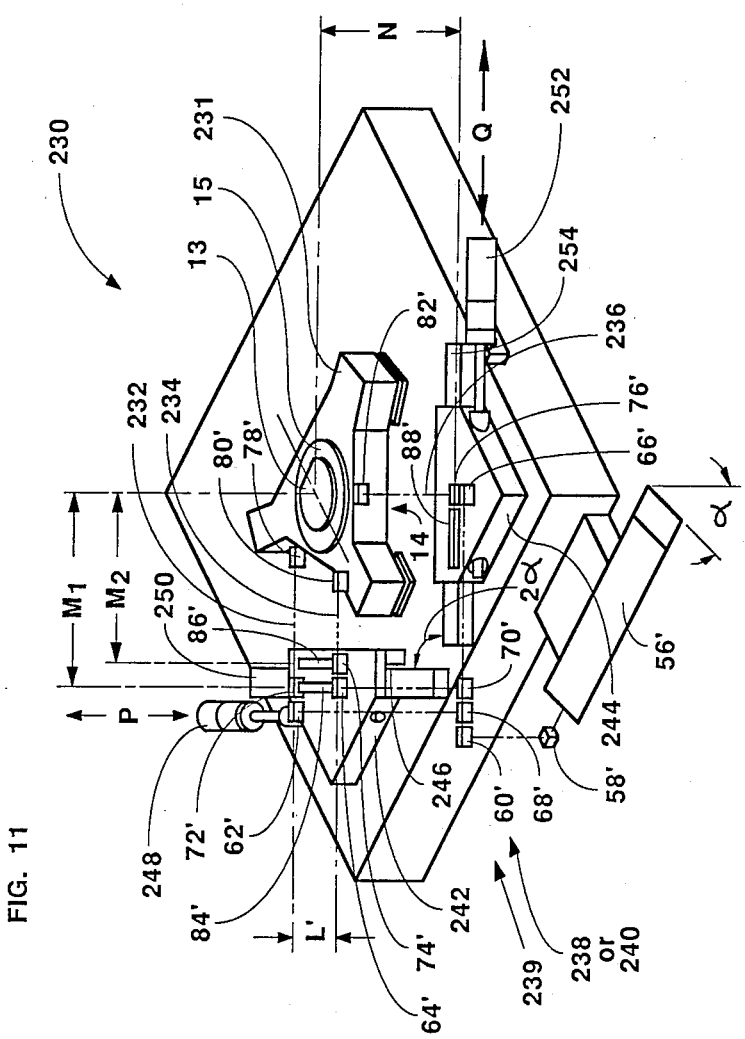
FIG. 11 is an isometric view of an improved gas bearing X-Y-θ stage assembly in accordance with another preferred embodiment of the present invention wherein first and second gas bearing slide mounted interferometers move along reference surfaces symmetrically positioned with respect to the Y-axis of the improved gas bearing X-Y-θ stage assembly.

Incorporated U.S. Pat. No. 4,311,390 discloses an interferometrically controlled X-Y stage having inherently orthogonal X and Y axes of motion, as mentioned hereinbefore. FIG. 11 shows an X-Y-θ stage assembly 230 which also has inherently orthogonal X and Y axes of motion wherein the inherent orthogonality is achieved in a related manner. The X-Y-$\theta$ stage assembly 230 comprises an X-Y-$\theta$ stage 231 which is identical to the X-Y-$\theta$ stage 11 except for the mounting of retroreflectors 78', 80' and 82' as explained hereinafter. The X-Y-$\theta$ stage assembly 230 comprises X-Y-$\theta$ linear motor 14 in an identical manner as the X-Y-$\theta$ stage assembly 10. The X-Y-$\theta$ stage assembly 230 also comprises three interferometer distance measuring paths 232, 234 and 236 of an $M_1$-$M_2$-N interferometer measuring sub-system 238 of an X-Y-$\theta$ interferometer measuring and control system 240, for measuring distances $M_1$, $M_2$ and N, respectively. The $M_1$-$M_2$-N interferometer measuring sub-system 238 may comprise an optical laser interferometer system 239 similar to the optical laser interferometer system 57 used in the X-Y-$\theta$ inteferometer measuring system 54 and each of the system components employ the same reference numbers as were employed with the optical laser interferometer system 57 (with those of the optical laser interferometer system 239 being primed).

The difference between the two measurement sub-systems is that the interferometers and receivers of the optical laser interferometer system 239 are mounted on gas bearing slides which move along P and Q axes of motion which are symmetrically disposed on either side of the Y-axis of motion of the X-Y-$\theta$ stage 231. An alternate type of slide assembly is shown wherein a P slide 242 and a Q slide 244 are supported and guided by stem and loading gas bearings 246. The P slide 242 is driven by a P-axis drive 248 along a P-axis guideway 250 and the Q slide 244 is driven by a Q-axis drive 252 along a Q-axis guideway 254. The 33% beamsplitter 68' and 50% beamsplitter 70' have a reflection angle which is the complement of the included angle, $2\alpha$, between the guideways 250 and 254. If the laser source 56' is mounted orthogonaly with respect to the Y-axis (as is shown in the drawing) then it must be rotated by half of the included angle (or $\alpha$) between the guideways 250 and 254 as shown in order to maintain the proper polarization required in the Hewlett-Packard interferometer system (see the incorporated system operating and service manual). The interferometer distance measuring paths 232 and 234, which measure $M_1$ and $M_2$, respectively, are parallel and are separated by a length L'. The location of the X-Y-$\theta$ stage 231 in a direction orthogonal to the P-axis of motion, M, is determined by $$M = (M_1 + M_2)/2,$$

the X-Y-$\theta$ stage angle, $\theta$, is determined by $$\theta \simeq \arctan(M_2 - M_1)/L', \text{ ps}$$

and the X-Y-$\theta$ stage location orthogonal to the Q-axis of motion is N.

As derived in incorporated U.S. Pat. No. 4,311,390, the X-Y-$\theta$ stage location along the Y-axis of motion, Y, is determined by $$Y = (\sin \alpha)(M + N)/2,$$

and the X-Y-$\theta$ stage location along the X-axis of motion, X, is determined by $$X = (\cos \alpha)(M - N)/2.$$

The inherent orthogonality of the X and Y movements of the X-Y-$\theta$ stage 231 along the X and Y axes of motion is substantiated by the fact that Y is a function of sin $\alpha$, whereas X is a function of cos $\alpha$, and by the fact that such sine and cosine terms inherently exist in quadrature.

Figure 12:
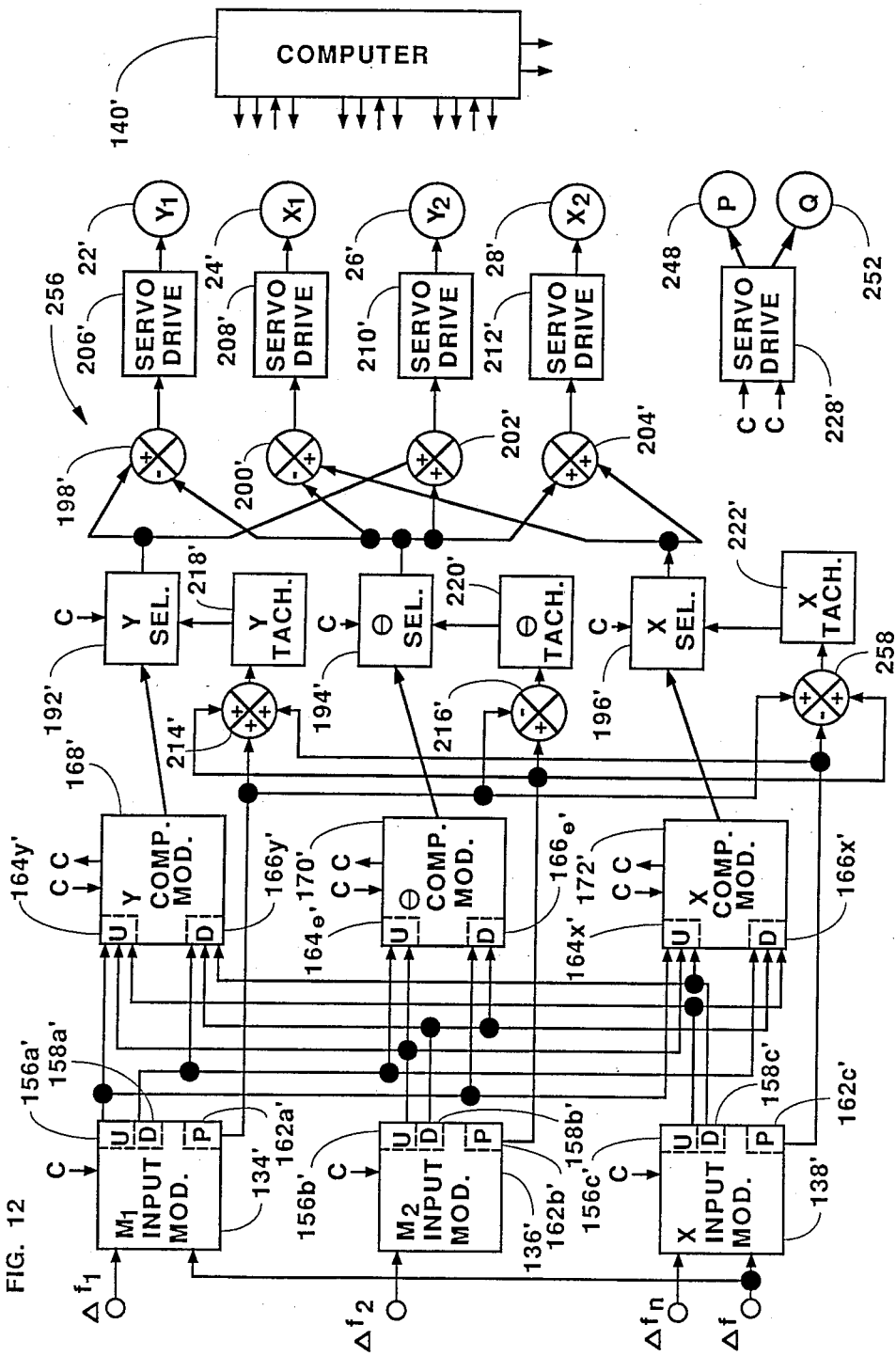
FIG. 12 is a detailed block diagram of non-interferometer portions of an Z-Y-θ interferometer measurement and control system used to control the improved gas bearing X-Y-θ stage assembly of FIG. 11.

FIG. 12 shows a detailed block diagram of a circuit 256 comprising non-interferometer portions of the X-Y-$\theta$ interferometer measuring and control system 240. Except for an additional X summing circuit 258, the component elements of the circuit 256 are functionally identical with the circuit 132 of the X-Y-$\theta$ interferometer measuring and control system 55 and they employ the same reference numbers (with those of the circuit 256 being primed). The difference between circuits 256 and 132 is in the names of the input modules (with $M_1$, $M_2$ and N being substituted for $Y_1$, $Y_2$ and X, respectively) and the interconnection of the component elements.

The new connections are as follows: $M_1$ input module 134' output terminal 156a' is connected to Y comparator module 168' input terminal 164y', $\theta$ comparator module 170' input terminal 166$\theta$' and x comparator module 172' input terminal 164x'; $M_1$ input module 134' output terminal 158a' is connected to Y comparator module 168' input terminal 166y', $\theta$ comparator module 170' input terminal 164$\theta$' and X comparator module 172' input terminal 166x'; $M_2$ input module 136' output terminal 156b' is connected to Y comparator module 168' input terminal 164y', $\theta$ comparator module 170' input terminal 164$\theta$' and X comparator module 172' input terminal 164x'; $M_2$ input module 136' output terminal 158b' is connected to Y comparator module 168' input terminal 166y', $\theta$ comparator module 170' input terminal 166$\theta$' and X comparator module 172' input terminal 166x'; N input module 138' output terminal 156c' is connected to Y comparator module 168' input terminal 164y' and X comparator module 172' input terminal 166x'; and N input module 138' output terminal 158c' is connected to Y comparator module 168' input terminal 166y' and X comparator module 172' input terminal 164x'. $M_1$ input module 134' output terminal 162a' is connected to a positive input terminal to the summing circuit 214', a negative input terminal to the summing circuit 216' and a positive input terminal to the summing circuit 258. $M_2$ input module 136' output terminal 162b' is connected to a positive input terminal to the summing circuit 214', a positive input terminal to the summing circuit 216' and a positive input terminal to the summing circuit 258. N input module 138' output terminal 162c' is connected to a positive input terminal to the summing circuit 214' and a negative input terminal to the summing circuit 258. Thus connected, the non-interferometer portions 256 of the interferometer measuring and control system 240 positions the X-Y-$\theta$ stage 231 precisely at the Y, and X axis positions specified by the $Y_e$, $\theta_e$ and $X_e$ digital end point data signals stored in the registers 180' by the computer 140', as phase shifted by the data selectors 152' in response to the three bit select code signals supplied by the computer.

Figure 13:
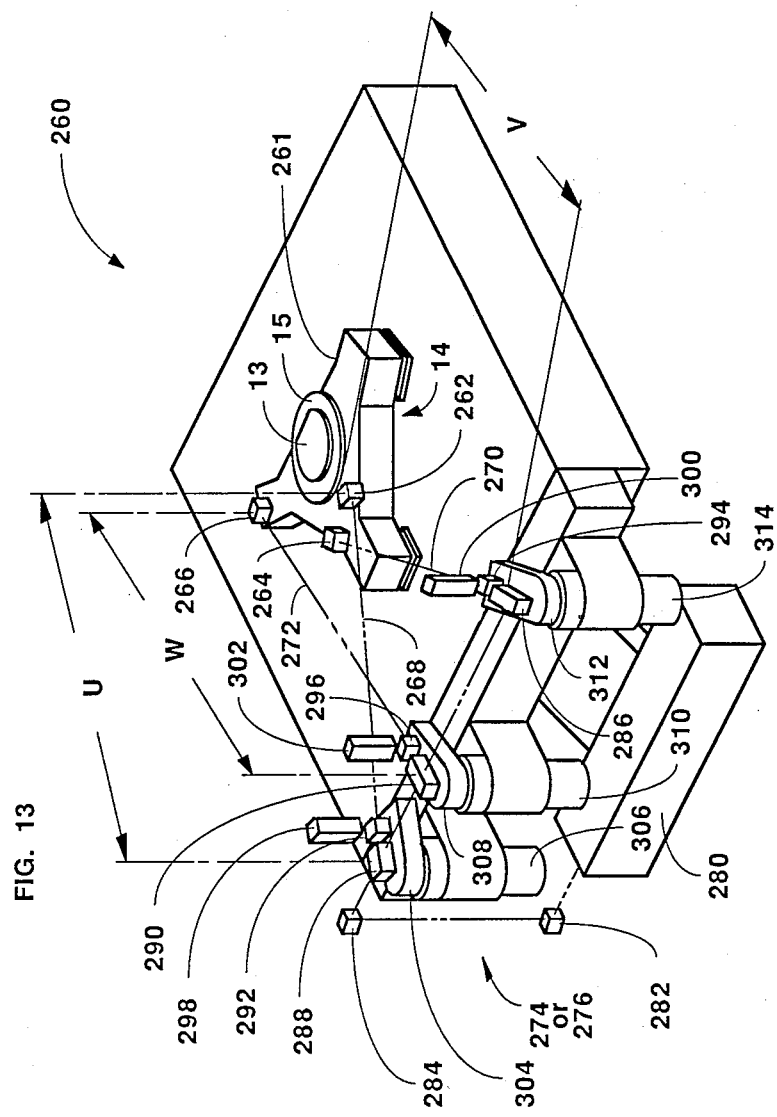
FIG. 13 is an isometric view of an improved gas bearing X-Y-θ stage assembly in accordance with still another preferred embodiment of the present invention wherein three gas bearing spindle mounted interferometers are used with the improved gas bearing X-Y-θ stage assembly.

Shown in FIG. 13 is an X-Y-$\theta$ stage assembly 260 wherein three axis interferometer control is achieved without translational movement of the interferometers. The X-Y-$\theta$ stage assembly 260 comprises an X-Y-$\theta$ stage 261 which is identical to the X-Y-$\theta$ stage 11 except for the mounting of retroreflectors 262, 264 and 266 as explained hereinafter. The X-Y-$\theta$ stage assembly 260 comprises X-Y-$\theta$ linear motor 14 in an identical manner as the X-Y-$\theta$ stage assembly 10. The X-Y-$\theta$ stage assembly 260 also comprises three interferometer distance measuring paths 268, 270 and 272 of a U-V-W interferometer measuring sub-system 274 of an X-Y-interferometer measuring and control system 276, for measuring distances U, V and W, respectively. The U-V-W interferometer measuring sub-system 274 may comprise an optical laser interferometer system 278 similar to the optical laser interferometer system 57 used in the X-Y-$\theta$ interferometer measuring system 54.

The optical laser interferometer system 278 is comprised of a laser source 280, beam benders 282, 284 and 286, a 33% beam splitter 288, 50% beam splitter 290, interferometers 292, 294 and 296, the retroreflectors 262, 264 and 266, and receivers 298, 300 and 302. The laser source 280, and beam benders 282 and 284 are fixedly mounted with respect to the base assembly 18. The 33% beam splitter 288, interferometer 292, and receiver 298 are mounted on a rotating spindle 304 which is sychronously directed, by a motor-encoder 306, such that optical coupling is maintained with the retroreflector 262 mounted on the X-Y-$\theta$ stage 26. The interferometer distance measuring path 268 comprises the optical coupling between the interferometer 292 and the retroreflector 262. The 50% beam splitter 290, interferometer 296, and receiver 302 are mounted on a rotating spindle 308 which is sychronously directed, by a motor-encoder 310, such that optical coupling is maintained with the retroreflector 266 mounted on the X-Y-$\theta$ stage 261. The interferometer distance measuring path 272 comprises the optical coupling between the interferometer 296 and the retroreflector 266. The beam bender 286, interferometer 294, and receiver 300 are mounted on a rotating spindle 312 which is synchronously directed, by a motor-encoder 314, such that optical coupling is maintained with the retroreflector 264 mounted on the X-Y-$\theta$ stage 261. The interferometer distance measuring path 270 comprises the optical coupling between the interferometer 294 and the retroreflector 264. The rotating spindles 304, 308 and 312 must have truth of rotation that is of comparable accuracy (approximately one micro-inch) to the interferometric measurements and can comprise gas bearing spindles. Suitable gas bearing spindles are shown, for instance, in now abandoned U.S. patent application Ser. No. 729,049 entitled Statically Pressurized Compact Spindle Bearing Assembly, filed on Apr. 30, 1985 by Edward H. Phillips.

Figure 14:
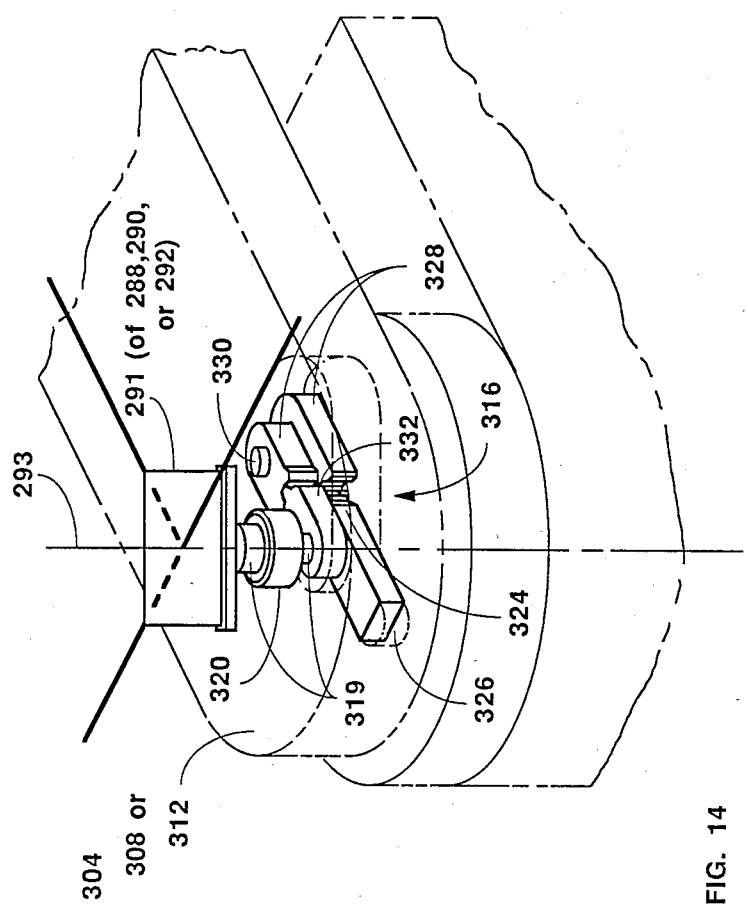
FIG. 14 is an isometric view of a variable angle beam bender mount used with the gas bearing spindle mounted interferometers of the improved gas bearing X-Y-θ stage assembly of FIG. 13 to enable rotation of the interferometers.

Optical coupling between the interferometers and the retroreflectors must be maintained during movement of the rotating spindles. As shown in FIG. 14, the reflective surface of a suitably coated reflective element 291 of the 33% beam splitter 288, 50% beam splitter 290, or beam bender 286 is located such that the axis of rotation 293 of the rotating spindle 304, 308 or 312, respectively, is coplaner with the reflective plane. Also, the reflective element 291 must be rotated by one-half the angle of rotation of the rotating spindle 304, 308 or 312. FIG. 14 shows a variable angle beam splitter or bender mount 316 wherein the reflective element 291 is mounted on a bar 318 rotatably mounted on the uppermost end of a shaft 319 with a bearing 320. The shaft 319 is driven through an angle equal to one-half the angle of the spindle by a 1:2 gear set 322. The 1:2 gear set 322 comprises a gear segment 324 located in a slot 325 formed in the spindle and rotating with the spindle; a segmented gear cluster 328 rotating about a pin 330 fixed mounted to the non-rotating body of the spindle; and a gear segment 332 fixedly mounted to the lowermost end of the shaft 319. In operation, the spindle drives the gear segment 324 which drives the segmented gear cluster 328 which, in turn, drives the gear segment 332. The pitch radii of the various gear segments must be chosen so their overall ratio is precisely 1:2 and they must mesh properly as well. One set of pitch radii ratios that satisfies these requirements is 14:21 times 15:20.

Figure 15:
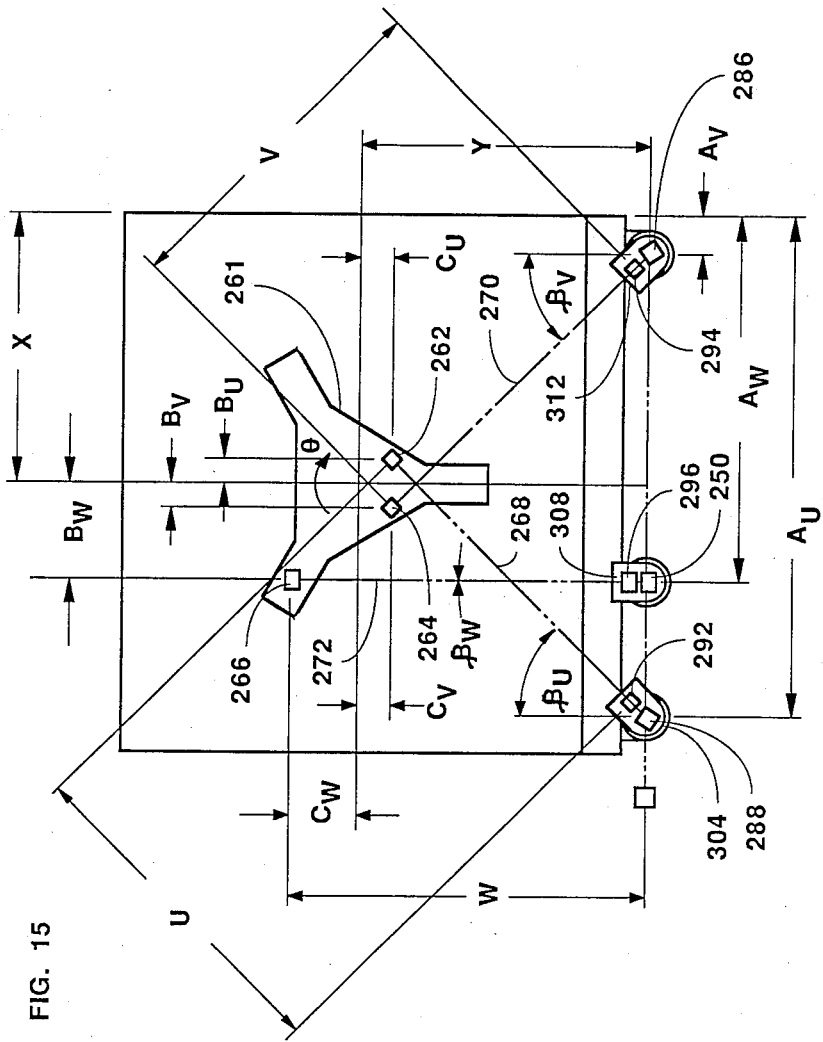
FIG. 15 is a plan view of the improved gas bearing X-Y-θ stage assembly of FIG. 13 showing three interferometer measuring paths used for locating the position of an X-Y-θ stage of the gas bearing X-Y-stage assembly.
Figure 16:
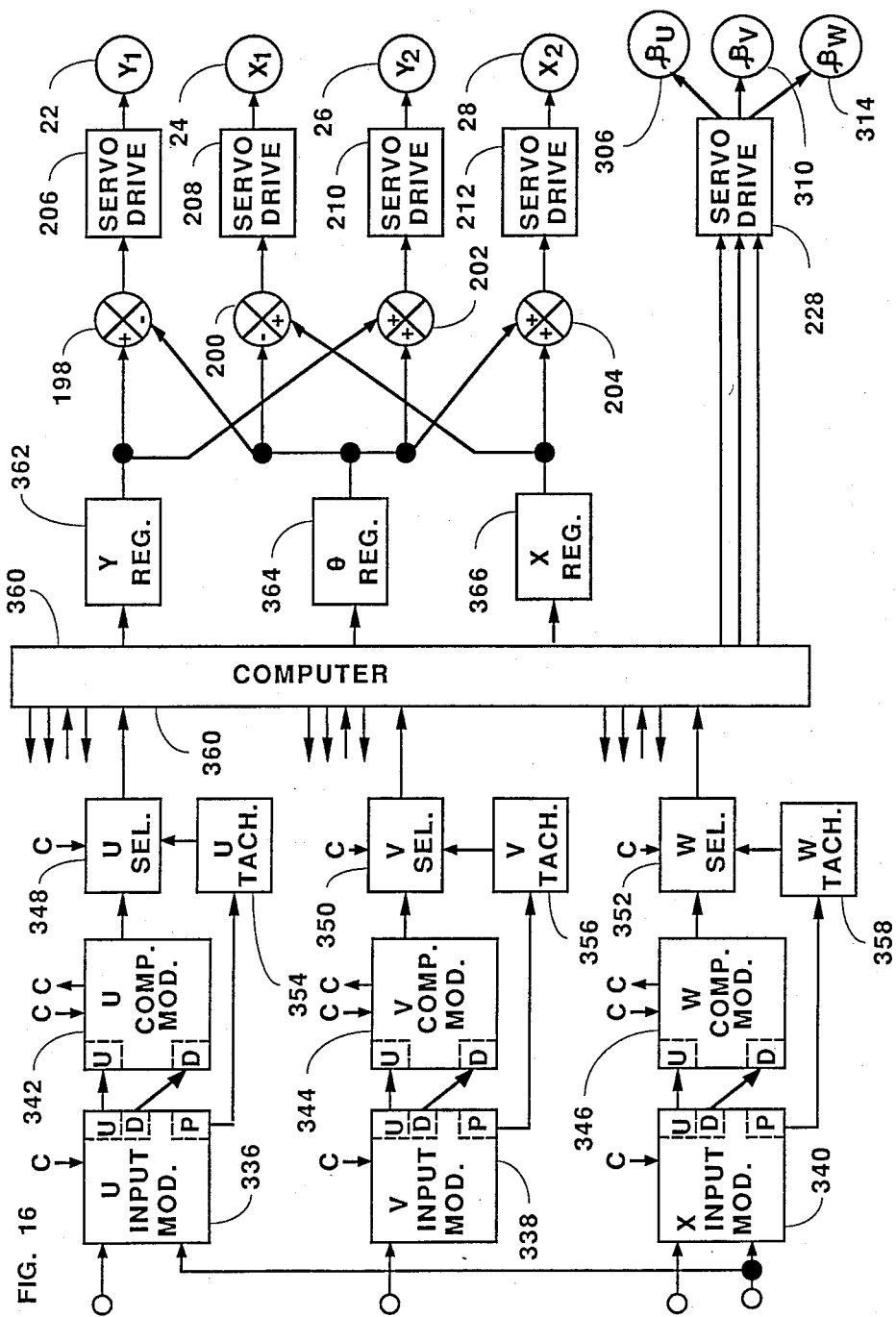
FIG. 16 is a detailed block diagram of non-interferometer portions of an X-Y-θ interferometer measurement and control system used to control the improved gas bearing X-Y-θ stage assembly of FIG. 13.

The three interferometer distance measuring paths 268, 270 and 272 are oriented in an independent manner as shown in FIG. 15. They comprise adequate positional information to enable three dimensional control of the X-Y-$\theta$ stage 261. However, it is not possible to manipulate the associated control signals by simple summing networks as with X-Y-$\theta$ stage assemblies 10 and 230 because no combination of the three interferometer distance measuring paths 268, 270 and 272 comprise an orthogonal or parallel measurement set. It is necessary to use trigonometric algorithems to compute path lengths and velocities. Since all calculations must be stored in registers and updated at rep rates significantly higher (i.e. 500–1000 Hz) than the unity gain frequencies (i.e. 25–50 Hz) of the servo systems controlling the position of the stage 261, it is apparent that transcendental equations requiring iterative calculations are not feasible. FIG. 16 shows a detailed block diagram of a circuit 333 that permits non-iterative computation of the control functions of an interferometer measurement and control system 334 used to control the motion of the X-Y-$\theta$ stage 261 along the X, Y and $\theta$ axes of motion.

As with circuits 132 and 256, the circuit 333 utilizes three input modules 336, 338 and 340, each compising the circuit 141 (see FIG. 8); three comparator modules 342, 344 and 346, each comprising the circuit 171 (see FIG. 9); three selector circuits 348, 350 and 352; and three tachometer stabilizer circuits 354, 356 and 358, each comprising the circuit 221 (see FIG. 10). The difference between the circuit 333, and either circuit 132 or circuit 256, is that in circuit 333 three sets of an input module, comparator module, selector circuit and tachometer stabilizer circuit are each interconnected to a computer 360 to process the outputs of the three interferometer distance measuring paths 268, 270 and 272.

The computer 360 determines a binary select code and an end point signal applied to each variable phase shifter 142 and register 180 of the circuits 141 and 171, respectively, for each measuring distance U, V and W according to values determined by the following set of equations:

$$U_e = (Y_e - C_u\cos\theta_e - B_u\sin\theta_e)/\cos \arctan [(-X_e + A_u +$$

$$B_u\cos\theta_e - C_u\sin\theta_e)/(Y_e - C_u\cos\theta_e - B_u\sin\theta_e)],$$

$$V_e = (Y_e - C_v\cos\theta_e - B_v\sin\theta_e)/\cos \arctan [(-X_e + A_v +$$

$$B_v\cos\theta_e - C_v\sin\theta_e)/(Y_e - C_v\cos\theta_e - B_v\sin\theta_e)]$$

and $$W = (Y_e - C_w\cos\theta_e - B_w\sin\theta_e)/\cos \arctan [(-X_e +$$

$$A_w - B_w\cos\theta_e - C_w\sin\theta_e)/(Y_e - C_w\cos\theta_e - B_w\sin\theta_e)],$$

where $Y_e$, $\theta_e$ and $X_e$ are the desired end point position values of the X-Y-$\theta$ stage 261 along the Y, $\theta$ and X axes of motion, respectively, $A_u$, $A_v$ and $A_w$ are the values of the X-direction coordinates of the axes of rotation of the spindles 304, 308 and 312, respectively, $B_u$, $B_v$ and $B_w$ are the values of the X-direction offsets of the retroreflectors 262, 264 and 266, respectively, and $C_u$, $C_v$ and $C_w$ are the values of the Y-direction offsets of the retroreflectors 262, 264 and 266, respectively. The computer 360 also determines a series of digital velocity signals which is stored in each register 182 of the circuits 171 according to values determined by the following set of equations:

$$dU/dt_1 = (\partial U/\partial Y)(dY/dt) + (\partial U/\partial \theta)(d\theta/dt) + (\partial U/\partial X)(dX/dt),$$

$$dV/dt_1 = (\partial V/\partial Y)(dY/dt) + (\partial V/\partial \theta)(d\theta/dt) + (\partial V/\partial X)(dX/dt)$$

and $$dW/dt_1 = (\partial W/\partial Y)(dY/dt) + (\partial W/\partial \theta)(d\theta/dt) + (\partial W/\partial X)(dX/dt),$$

where the partial derivatives $(\partial U/\partial Y)$, $(\partial U/\partial \theta)$, $(\partial U/\partial X)$, $(\partial V/\partial Y)$, $(\partial V/\partial \theta)$, $(\partial V/\partial X)$, $(\partial W/\partial Y)$, $(\partial W/\partial \theta)$, and $(\partial W/\partial x)$ are determined from the equations for $U_e$, $V_e$ and $W_e$ (above), and $(dY/dt)$, $(d\theta/dt)$ and $(dX/dt)$ are the desired velocities along the Y, $\theta$ and X axes of motion.

In response to a non-zero output from any of the comparators 178 in any of the comparator modules 342, 344 or 346 to computer 360 activates the selector circuits 348, 350 and 352 to throughput velocity error output signals $dU/dt_2$, $dV/dt_2$ and $dW/dt_2$ from the comparator modules 342, 344 or 346 to the computer for analysis as indicated by the following equations:

$$dY/dt' = (dU/dt_2)\cos\beta_u + (dV/dt_2)\cos\beta_v + (dW/dt_2)\cos\beta_w,$$

$$d\theta/dt' = -(1/r_u)(dU/dt_2) + (1/r_v)(dV/dt_2) + (1/r_w)(dW/dt_2)$$

and $$dX/dt' = -(dU/dt_2)\sin\beta_u + (dV/dt_2)\sin\beta_v - (dW/dt_2)\sin\beta_w$$

and where $dY/dt'$, $d\theta/dt'$ and $dX/dt'$ are computed velocity errors along the Y, $\theta$ and X axes of motion, respectively, $\beta_u$, $\beta_v$ and $\beta_w$ are the motor-encoder 306, 310 and 314 angles with respect to the Y-axis of motion, and $r_u$, $r_v$ and $r_w$ are determined by the following set of equations:

$$r_u = (C_u\cos\theta + B_u\sin\theta)\sin\beta_u + (B_u\cos\theta - C_u\sin\theta)\cos\beta_u,$$

$$r_v = (C_v\cos\theta + B_v\sin\theta)\sin\beta_v + (B_v\cos\theta - C_v\sin\theta)\cos\beta_v$$

and $$r_w = (C_w\cos\theta + B_w\sin\theta)\sin\beta_w + (B_w\cos\theta - C_w\sin\theta)\cos\beta_w.$$

The computed velocity errors $dY/dt'$, $d\theta/dt'$ and $dX/dt'$ from the computer 360 are sequentially stored in a Y register 362, a $\theta$ register 364 and an X register 366, respectively. The output signals from the Y register 362, $\theta$ register 364 and X register 366 are equivalent to the outputs from the Y selector 192, $\theta$ selector 194 and X selector 196, respectively, of the X-Y-$\theta$ interferometer measuring and control system 55, and they are applied to the same selected ones of the four summing circuits 198, 200, 202 and 204 as described hereinbefore with respect to the interferometer measuring and control system 55. The outputs of the summing circuits 198, 200, 202 and 204 are then applied to the servo drives 206, 208, 210 and 212 which activate the four sub-elements 22, 24, 26 and 28 of the moving element 12 of the X-Y-$\theta$ linear motor 14 to reduce the computed velocity errors as also described hereinbefore.

When the X-Y-$\theta$ stage 261 has been moved to the nominal endpoint location and the output signals to the computer 360 of the comparitors 178 of the U, V and W comparator modules 342, 344 and 346, respectively, are all zero, the computer 360 activates the U, V and W selector circuits 348, 350 and 352, respectively, to throughput tachometer stabilized final position error signals $\partial U$, $\partial V$ and $\partial W$ from the tachometer stabilizer circuits 354, 356 and 358 to the computer for analysis as indicated by the following equations:

$$\partial Y = \partial U\cos\beta_u + \partial V\cos\beta_v + \partial W\cos\beta_w,$$

$$\partial \theta = -(1/r_u)\partial U + (1/r_v)\partial V + (1/r_w)\partial W$$

and $$\partial X = -\partial U\sin\beta_u + \partial V\sin\beta_v + \partial W\sin\beta_w,$$

where $\partial Y$, $\partial \theta$ and $\partial X$ are computed position errors along the Y, $\theta$ and X axes of motion, respectively. The Y, $\theta$ and X registers 362, 364 and 366, respectively, the summing circuits 198, 200, 202 and 204, and the sub-elements 22, 24, 26 and 28 are utilized to cause the computed position errors $\partial Y$, $\partial \theta$ and $\partial X$ to be reduced to zero.

I claim:

1. An X-Y-$\theta$ stage assembly comprising:

a base having a substantially flat surface;

stage means movable along orthogonal X- and Y-axes and rotatable about an orthogonal third axis for holding a workpiece and for moving the workpiece in a plane parallel to the substantially flat surface, said stage means having a first, second, and third retroreflector, with each retroreflector fixedly mounted thereto;

and control means for controlling movement of said stage means, said control means comprising:

transport means responsive to a first circuit means, said transport means comprising first and second gas bearing slide assemblies which are movable parallel to said Y-axis and X-axis, respectively, over said base;

first interferometer means which is fixedly mounted to said first gas bearing slide assembly and which is separated an optical distance D1 from said first retroreflector, for measuring changes in a first parameter associated with changes in said distance D1, measured along the X-axis, and for providing a first signal corresponding to changes in the distance D1;

second interferometer means which is fixedly mounted to said second gas bearing slide assembly and which is separated an optical distance D2 from said second retroreflector, for measuring changes in a second parameter associated with changes in said distance D2, measured along the Y-axis, and for providing a second signal corresponding to changes in said distance D2;

third interferometer means which is fixedly mounted to said second gas bearing slide assembly and which is separated an optical distance D3 from said third retroreflector, for measuring changes in a third parameter associated with changes in said distance D3, measured along the Y-axis, and for providing a third signal corresponding to changes in said distance D3;

said transport means for moving said first interferometer means parallel to said Y-axis to provide a position reference for said first interferometer means and to provide optical coupling between said first interferometer means and said first retroreflector as said stage moves, and for moving said second and third interferometer means parallel to said X-axis to provide a position reference for said second and third interferometer means and to provide optical coupling between said second and third interferometer means and said second and third retroreflectors, respectively, as said stage moves;

and second circuit means for causing said stage means to move to a preselected X-Y position and a preselected orientation about said third axis in response to said first, second, and third signals.

2. An X-Y-θ stage assembly as in claim 1 wherein said transport means further comprises first and second motor-encoder means for synchronously positioning said first and second gas bearing slide assemblies in relation to movement of said stage means to provide said optical coupling.

3. An X-Y-θ stage assembly comprising:
a base having a substantially flat surface;
stage means movable along orthogonal X- and Y-axes and rotatable about an orthogonal third axis for holding a workpiece and for moving the workpiece in a plane parallel to the substantially flat surface, the stage means having first, second, and third retroreflectors, wherein each retroreflector is fixedly mounted thereto;
and control means for controlling movement of the stage means, the control means comprising:
first interferometer means separated an optical distance D1 from said first retroreflector, for measuring changes in a first parameter associated with changes in said distance D1, measured along a first direction, and for providing a first signal corresponding to changes in the distance D1;
second interferometer means separated an optical distance D2 from said second retroreflector, for measuring changes in a second parameter associated with changes in said distance D2, measured along a second direction, and for providing a second signal corresponding to changes in said distance D2;
third interferometer means separated an optical distance D3 from said third retroreflector, for measuring changes in a third parameter associated with changes in said distance D3, measured along said second direction, and for providing a third signal corresponding to changes in said distance D3;
transport means responsive to a first circuit means for moving said first, second, and third interferometer means to provide optical coupling between said first, second, and third interferometer means and said first, second, and third retroreflectors, respectively;
and second circuit means for causing said stage means to move to a preselected X-Y position and a preselected orientation about said third axis in response to said first, second, and third signals;

and wherein said transport means moves said first interferometer means parallel to a third direction nominally orthogonal to said first direction to provide a position reference for said first interferometer means and to provide said optical coupling between said first interferometer means and said first retroreflector as said stage moves, and wherein said transport means moves said second and third interferometer means parallel to a fourth direction moninally orthogonal to said second direction to provide a position reference for said second and third interferometer means and to provide said optical coupling between said second and third interferometer means and said second and third retroreflectors, respectively, as said stage moves, and wherein said fourth direction is oriented at an angle A relative to said third direction, said third and fourth directions being oriented such that said Y-axis bisects said angle A, thereby providing inherently orthogonal X and Y axes.

4. An X-Y-θ stage assembly as in claim 3 wherein said transport means further comprises first and second gas bearing slide asssemblies which are movable parallel to said first and second directions, respectively, over said base, and wherein said first interferometer means is fixedly mounted to said first gas bearing slide assembly and said second and third interferometer means are fixedly mounted to said second gas bearing slide assembly.

5. An X-Y-θ stage assembly as in claim 4 wherein said transport means further comprises first and second motor-encoder means for synchronously positioning said first and second gas bearing slide assemblies in relation to movement of said stage means to provide said optical coupling.

6. An X-Y-θ stage assembly comprising:
a base having a substantially flat surface;
stage means movable along orthogonal X- and Y-axes and rotatable about an orthogonal third axis for holding a workpiece and for moving the workpiece in a plane parallel to the substantially flat surface, the stage means having first, second, and third retroreflectors, wherein each retroreflector is fixedly mounted thereto; and
control means for controlling movement of said stage means, said control means comprising:
first interferometer means separated an optical distance D1 from said first retroreflector, for measuring changes in a first parameter associated with changes in said distance D1, measured along a first direction, and for providing a first signal corresponding to changes in the distance D1;
second interferometer means separated an optical distance D2 from said second retroreflector, for measuring changes in a second parameter associated with changes in said distance D2, measured along a second direction, and for providing a second signal corresponding to changes in said distance D2;
third interferometer means separated an optical distance D3 from said third retroreflector, for measuring changes in a third parameter associated with changes in said distance D3, measured along said second direction, and for providing a third signal corresponding to changes in said distance D3;

transport means responsive to a first circuit means for moving said first, second, and third interferometer means to provide optical coupling between said first, second, and third interferometer means and said first, second, and third retroreflectors, respectively, said transport means comprising first spindle means on which said first interferometer means is mounted and first motor-encoder means for synchronously rotating said first spindle means in relation to movement of said stage means to provide a position reference for said first interferometer means and to provide said optical coupling as said stage moves; and second circuit means for causing said stage means to move to a preselected X-Y position and a preselected orientation about said third axis in response to said first, second, and third signals;

said second circuit means comprising computer means for calculating a displacement U of said stage in a first direction corresponding to said optical distance D1 between said first interferometer and said first retroreflector, a displacement V of said stage in a second direction corresponding to said optical distance D2 between said second interferometer and said second retroreflector, a displacement W of said stage in a third direction corresponding to said optical distance D3 between said third interferometer and said third retroreflector, a motion velocity dU/dt of said stage in said first direction, a motion velocity dV/dt of said stage in said second direction, and a motion velocity dW/dt of said stage in said third direction, in response to signals corresponding to desired end point locations along said X and Y axes, a desired end point orientation about said third axis, and current positions of said stage along said first, second, and third directions, and wherein said second circuit means provides feedback control signals to said stage means based on said U, V, and W displacements calculated by said computer means.

7. An X-Y-$\theta$ stage assembly as in claim 6 wherein said transport means comprises second spindle means on which said second interferometer means is mounted and second motor-encoder means for synchronously rotating said second spindle means in relation to movement of said stage means to provide a position reference for said second interferometer means and to provide said optical coupling as said stage moves.

8. An X-Y-$\theta$ stage assembly as in claim 7 wherein said transport means comprises third spindle means on which said third interferometer means is mounted and third motor-encoder means for synchronously rotating said third spindle means in relation to movement of said stage means to provide a position reference for said third interferometer means and to provide said optical coupling as said stage moves.

9. An X-Y-$\theta$ stage assembly comprising:
a base having a substantially flat surface;
stage means movable along orthogonal X- and Y-axes and rotatable about an orthogonal third axis for holding a workpiece and for moving the workpiece in a plane parallel to the substantially flat surface, said stage means having a first, second, and third retroreflector, with each retroreflector fixedly mounted thereto; and control means for controlling movement of the stage means, said control means comprising:
transport means responsive to a first circuit means, said transport means having a first gas bearing slide with a member movable parallel to said Y-axis and a fixed member mounted to the base with a motion reference surface of the fixed member oriented parallel to the Y-axis, said transport means also having a second gas bearing slide with a member movable parallel to said X-axis and another fixed member mounted on the base with a motion reference surface of the another fixed member oriented parallel to the X-axis;

first interferometer means which is mounted on the moving member of the first gas bearing slide assembly, for measuring a distance D1 between the motion reference surface of the fixed member of the first gas bearing slide and the first retroreflector along a direction parallel to the X-axis, and for providing a first signal corresponding to changes in the distance D1, wherein the position of the moving member of the first gas bearing slide is responsive to the first circuit means to provide optical coupling between the first interferometer means and the first retroreflector when the stage means in moved parallel to the Y-axis;

second and third interferometer means which are mounted on the moving member of the second gas bearing slide, for measuring distances D2 and D3 between the motion reference surface of the fixed member of the second gas bearing slide and the second and third retroreflectors, respectively, along directions parallel to the Y-axis, and for providing second and third signals corresponding to changes in the distances D2 and D3, respectively, wherein the position of the moving member of the second gas bearing slide is also responsive to the first circuit means to provide optical coupling between the second and third interferometer means and the second and third retroreflectors, respectively, when the stage means is moved parallel to the X-axis; and second circuit means for causing the stage means to move to a preselected X-Y position and a preselected orientation about the third axis in response to the first, second, and third signals.

10. An X-Y-$\theta$ stage assembly as in claim 9 wherein the first and second gas bearing slides further comprise first and second motor-encoder means, respectively, for positioning the first and second gas bearing slides synchronously, respectively, with respect to motion of the stage means parallel to the Y- and X-axes, respectively.

11. An X-Y-$\theta$ stage assembly comprising:
a base having a substantially flat surface;
stage means movable along orthogonal X- and Y-axes and rotatable about an orthogonal third axis for holding a workpiece and for moving the workpiece in a plane parallel to the substantially flat surface, the stage means having first, second, and third retroreflectors, wherein each retroreflector is fixedly mounted thereto;
and control means for controlling movement of the stage means, the control means comprising:
transport means responsive to a first circuit means, said transport means having a first gas bearing slide with a movable member and with a fixed member mounted to the base with a motion reference surface of the fixed member oriented obliquely with respect to the Y-axis, said transport means also having a second gas bearing slide with a movable member and with another fixed member mounted on the base with a motion reference surface of the another fixed member oriented obliquely with respect to the Y-axis in a symmetrical manner with respect to the motion reference surface of the fixed member of the first gas bearing slide;

first interferometer means which is mounted on the moving member of the first gas bearing slide, for measuring a distance N between the motion reference surface of the fixed member of the first gas bearing slide and the first retroreflector along a direction orthogonal to the motion reference surface of the fixed member, and for providing a first signal corresponding to changes in the distance N, wherein the position of the moving member of the first gas bearing slide is responsive to the first circuit means to provide optical coupling between the first interferometer means and the first retroreflector when the stage means is moved parallel to the motion reference surface of the fixed member of the first gas bearing slide;

second and third interferometer means which are mounted on the moving member of the second gas bearing slide, for measuring distances M1 and M2 between the motion reference surface of the fixed member of the second gas bearing slide and the second and third retroreflectors, respectively, along directions orthogonal to the motion reference surface of the fixed member, and for providing second and third signals corresponding to changes in the distances M1 and M2, respectively, wherein the position of the moving member of the second gas bearing slide is also responsive to the first circuit means to provide optical coupling between the second and third interferometer means and the second and third retroreflectors, respectively, when the stage means is moved parallel to the motion reference surface of the second gas bearing slide; and second circuit means for causing the stage means to move to a preselected X-Y position and a preselected orientation about the third axis in response to the first, second, and third signals wherein motions of the stage means in a direction parallel to the Y-axis are computed as the sum of the first signal and the average of the second and third signals, and motions of the stage means in a direction parallel to the X-axis are computed as the difference of the first signal and the average of the second and third signals, thereby providing inherently orthogonal X- and Y-axes of motion.

12. An X-Y-$\theta$ stage assembly as in claim 11 wherein the first and second gas bearing slides further comprise first and second motor-encoder means, respectively, for positioning the first and second gas bearing slides synchronously, respectively, with respect to motion of the stage parallel to the motion reference surfaces of the fixed members of the first and second gas bearing slides, respectively.

13. An X-Y-$\theta$ stage assembly comprising:
a base having a substantially flat surface;
stage means movable along orthogonal X- and Y-axes and rotatable about an orthogonal third axis for holding a workpiece and for moving the workpiece in a plane parallel to the substantially flat surface, the stage means having first, second, and third retroreflectors, wherein each retroreflector is fixedly mounted thereto;

and control means for controlling movement of the stage means, the control means comprising:

transport means responsive to a first circuit means, said transport means comprising a first, second, and third spindle means, each with a rotating member and each with a fixed member mounted on the base, said transport means further comprising first, second, and third motor-encoder means responsive to the first circuit means for rotating said first, second, and third spindle means, respectively;

first interferometer means, which is mounted on the rotating member of the first spindle means, for measuring displacement values in a distance U between the axis of rotation of the first spindle means and the first retroreflector, and for providing a first signal corresponding to changes in the distance U, wherein the first motor-encoder means is responsive to the first circuit means for synchronously rotating the first spindle means to provide optical coupling between the first interferometer means and the first retroreflector when the stage means is moved orthogonally with respect to the direction corresponding to the distance U;

second interferometer means, which is mounted on the rotating member of the second spindle means, for measuring displacement values in a distance V between the axis of rotation of the second spindle means and the second retroreflector, and for providing a second signal corresponding to changes in the distance V, wherein the second motor-encoder means is also responsive to the first circuit means for synchronously rotating the second spindle means to provide optical coupling between the second interferometer means and the second retroreflector when the stage means is moved orthogonally with respect to the direction corresponding to the distance V;

third interferometer means, which is mounted on the rotating member of the third spindle means, for measuring displacement values in a distance W between the axis of rotation of the third spindle means and the third retroreflector, and for providing a third signal corresponding to changes in the distance W, wherein the third motor-encoder means is also responsive to the first circuit means for synchronously rotating the third spindle means to provide optical coupling between the third interferometer means and the third retroreflector when the stage means is moved orthogonally with respect to the direction corresponding to the distance W; and second circuit means comprising computer means for calculating required values of U, V and W and required motion velocities dU/dt, dV/dt and dW/dt in response to signals corresponding to desired end point locations for the stage means along the X- and Y-axes, a desired end point orientation of the stage means about the orthogonal third axis, and current positions of the stage means as determined by the measured values of U, V and W, wherein the computer means provides feedback control signals to the stage means based on the required values of U, V and W and velocity error signals $\delta(dX/dt)$, $\delta(dY/dt)$ and $\delta(d\theta/dt)$ along the X-axis, the Y-axis and about the orthogonal third axis, respectively, based on $\delta(dU/dt)$, $\delta(dV/dt)$ and $\delta(dW/dt)$ velocity error signals of the motion velocities $dU/dt$, $dV/dt$ and $dW/dt$, respectively, calculated by the computer means.

* * * * *